(12) United States Patent
Jang et al.

(10) Patent No.: US 12,477,908 B2
(45) Date of Patent: Nov. 18, 2025

(54) DISPLAY DEVICE

(71) Applicant: Samsung Display Co., Ltd., Yongin-si (KR)

(72) Inventors: Ki Sun Jang, Yongin-si (KR); Jang Gyoon Jeong, Goheung-gun (KR); Won Hee Nam, Hwaseong-si (KR); Suk Beom You, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 647 days.

(21) Appl. No.: 17/450,659

(22) Filed: Oct. 12, 2021

(65) Prior Publication Data

US 2022/0123096 A1 Apr. 21, 2022

(30) Foreign Application Priority Data

Oct. 16, 2020 (KR) .......................... 10-2020-0134107

(51) Int. Cl.
*H10K 59/131* (2023.01)
*H10K 59/122* (2023.01)

(52) U.S. Cl.
CPC ......... *H10K 59/131* (2023.02); *H10K 59/122* (2023.02)

(58) Field of Classification Search
CPC ....... H05B 33/26; H05B 33/12; H01L 27/156; H01L 2924/12041; H05K 2201/10106
See application file for complete search history.

(56) References Cited

U.S. PATENT DOCUMENTS

| 10,468,394 B1* | 11/2019 | Xi ....................... H10K 59/1275 |
| 10,910,512 B2 | 2/2021 | Sung |
| 10,943,947 B2 | 3/2021 | Im et al. |
| 2011/0089850 A1* | 4/2011 | Shibata .................. H05B 45/00 |
| | | 257/E33.001 |
| 2012/0326181 A1* | 12/2012 | Shibata ............... H01L 25/0753 |
| | | 257/E33.061 |
| 2017/0317228 A1 | 11/2017 | Sung |
| 2018/0019369 A1* | 1/2018 | Cho ...................... H01L 27/156 |

(Continued)

FOREIGN PATENT DOCUMENTS

| KR | 10-2019-0120467 A | 10/2019 |
| KR | 10-2019-0121894 A | 10/2019 |

(Continued)

*Primary Examiner* — Yuzhen Shen
(74) *Attorney, Agent, or Firm* — Womble Bond Dickinson (US) LLP

(57) ABSTRACT

A display device includes a first substrate, a conductive layer including a first voltage line, a second voltage line, and a third voltage line spaced from each other along a first direction on the first substrate, an interlayer insulating layer on the conductive layer, first and second electrodes on the interlayer insulating layer and spaced from each other along the first direction, a plurality of light emitting elements having at least one end on the first electrode or the second electrode, a first contact electrode on first ends of some of the plurality of light emitting elements and not overlapping the first electrode and the second electrode, and a second contact electrode on second ends of some of the plurality of light emitting elements, where the first electrode and the second electrode do not overlap the first voltage line and the third voltage line, respectively.

20 Claims, 22 Drawing Sheets

(56) References Cited

U.S. PATENT DOCUMENTS

| | | | |
|---|---|---|---|
| 2019/0115513 A1* | 4/2019 | Im | H05K 1/111 |
| 2019/0326348 A1 | 10/2019 | Im et al. | |
| 2020/0119244 A1* | 4/2020 | Kwon | H01L 33/62 |
| 2020/0212268 A1* | 7/2020 | Choi | H01L 33/504 |
| 2020/0258938 A1 | 8/2020 | Chai et al. | |
| 2021/0151624 A1 | 5/2021 | Sung | |
| 2021/0193734 A1 | 6/2021 | Im et al. | |
| 2021/0320231 A1 | 10/2021 | Kim et al. | |
| 2021/0359165 A1 | 11/2021 | Im et al. | |

FOREIGN PATENT DOCUMENTS

| | | |
|---|---|---|
| KR | 10-2020-0010701 A | 1/2020 |
| KR | 10-2020-0013824 A | 2/2020 |
| KR | 10-2020-0041430 A | 4/2020 |
| KR | 10-2020-0097869 A | 8/2020 |
| KR | 10-2020-0138479 A | 12/2020 |
| KR | 10-2021-0103602 A | 8/2021 |
| WO | WO 2016/080712 A1 | 5/2016 |

\* cited by examiner

DISPLAY DEVICE

CROSS-REFERENCE TO RELATED APPLICATION

This application claims priority to and the benefit of Korean Patent Application No. 10-2020-0134107 filed on Oct. 16, 2020 in the Korean Intellectual Property Office, the content of which in its entirety is incorporated by reference herein.

BACKGROUND

1. Field

The present disclosure relates to a display device.

2. Description of the Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

SUMMARY

An aspect of embodiments according to the present disclosure is to provide a display device having high luminance per unit area through the alignment of light emitting elements using an upper electrode and a lower electrode.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of the present disclosure given below.

According to an embodiment of the present disclosure, a display device includes a first substrate, a conductive layer including a first voltage line, a second voltage line, and a third voltage line spaced from each other along a first direction on the first substrate, an interlayer insulating layer on the conductive layer, first and second electrodes on the interlayer insulating layer and spaced from each other along the first direction, a plurality of light emitting elements having at least one end on the first electrode or the second electrode, a first contact electrode on first ends of some of the plurality of light emitting elements and not overlapping the first electrode and the second electrode, and a second contact electrode on second ends of some of the plurality of light emitting elements, wherein the first electrode and the second electrode do not overlap the first voltage line and the third voltage line, respectively, and the plurality of light emitting element includes first light emitting elements on the first electrode and the first voltage line, and second light emitting elements on the second electrode and the third voltage line.

The first contact electrode may be electrically connected to the first voltage line through a first contact hole penetrating the interlayer insulating layer, and the first end of at least one of the first light emitting elements may be in contact with the first contact electrode, and the second end of at least one of the first light emitting elements may be disposed on the first electrode.

The second electrode may be in contact with the second voltage line through a second contact hole penetrating the interlayer insulating layer, and the second contact electrode may be in contact with the second end of at least one of the second light emitting elements and the second electrode.

The plurality of light emitting elements may further include a third light emitting element having a first end not contacting the first contact electrode and a second end located on the first electrode, and a fourth light emitting element having a second end located on the second electrode and not contacting the second contact electrode, and the display device may further include a third contact electrode contacting the second end of the first light emitting element and the first end of the third light emitting element, a fourth contact electrode contacting the second end of the third light emitting element and a first end of the fourth light emitting element, and a fifth contact electrode contacting the second end of the fourth light emitting element and the first end of at least one of the second light emitting element.

The display device may further include a first bank on the interlayer insulating layer, wherein the first electrode and the second electrode may be located on the first bank and are spaced from each other.

The display device may further include third and fourth electrodes between the first electrode and the second electrode, a fifth light emitting element on the first electrode and the third electrode, and a sixth light emitting element on the fourth electrode and the second electrode.

The display device may further include a plurality of first sub-banks between the interlayer insulating layer and the first electrode and between the interlayer insulating layer and the second electrode, and a second sub-bank between the first sub-banks, wherein the third electrode and the fourth electrode may be spaced from each other on the second sub-bank.

The first light emitting elements and the second light emitting elements may be located on different first sub-banks, and the fifth light emitting element and the sixth light emitting element may be located between the plurality of first sub-banks and the second sub-bank.

The first contact electrode may be electrically connected to a first transistor located on the first substrate and connected to the first voltage line, and the first voltage line, the second voltage line, and the third voltage line may be located at a same layer as a source electrode of the first transistor.

The plurality of light emitting elements may further include a third light emitting element having both ends on the first electrode and the second electrode, the first contact electrode and the second contact electrode may do not overlap the first electrode and the second electrode, and the display device may further include a plurality of contact electrodes partially located on the first electrode or the second electrode.

The second contact electrode may be in contact with the second voltage line through a second contact hole penetrating the interlayer insulating layer, and at least one of the second light emitting elements may have the first end on the second electrode.

The display device may further include a plurality of first banks between the interlayer insulating layer and the first electrode and between the interlayer insulating layer and the second electrode, wherein the third light emitting element may be between the first banks.

The first light emitting element and the second light emitting element may be located on the plurality of first banks. and each of the first contact hole and the second contact hole may penetrate the first bank.

A shortest vertical distance between the first electrode and the first voltage line may be shorter than a length of the first light emitting element.

According to embodiment of the present disclosure, a display device includes a first substrate, a conductive layer including a first voltage line and a second voltage line on the first substrate and spaced from each other along a first direction and extending in a second direction, an interlayer insulating layer on the conductive layer, a first electrode extending in the second direction and on the interlayer insulating layer, the first electrode overlapping the second voltage line, a plurality of light emitting elements, at least one of the light emitting elements having one end on the first electrode and extending in one direction, a first contact electrode on an other end of the light emitting element, and a second contact electrode on the one end of the light emitting element and contacting the first electrode, wherein the first electrode and the first voltage line do not overlap each other in a thickness direction of the first substrate.

The first contact electrode may be connected to a conductive pattern electrically connected to the first voltage line through a first contact hole penetrating the interlayer insulating layer, and the first electrode may be connected to the second voltage line through a second contact hole penetrating the interlayer insulating layer.

The display device may further include a third voltage line spaced from the second voltage line in the second direction and not overlapping the first electrode in the thickness direction, wherein the plurality of light emitting elements may include a first light emitting element having an other end on the first voltage line and a second light emitting element having an other end on the third voltage line.

The first contact electrode may include a first extension portion on the other end of the first light emitting element, a second extension portion on the other end of the second light emitting element, and a first connection portion connecting the first extension portion and the second extension portion and spaced apart from the second contact electrode.

The first contact electrode may be on the other end of the first light emitting element, the second contact electrode may be on one end of the second light emitting element, and the display device may further include a third contact electrode located on one end of the first light emitting element and an other end of the second light emitting element to surround the second contact electrode.

The display device may further include a first bank between the first electrode and the interlayer insulating layer, wherein the first voltage line and the third voltage line may do not overlap the first bank in the thickness direction of the first substrate.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

Figure 1:
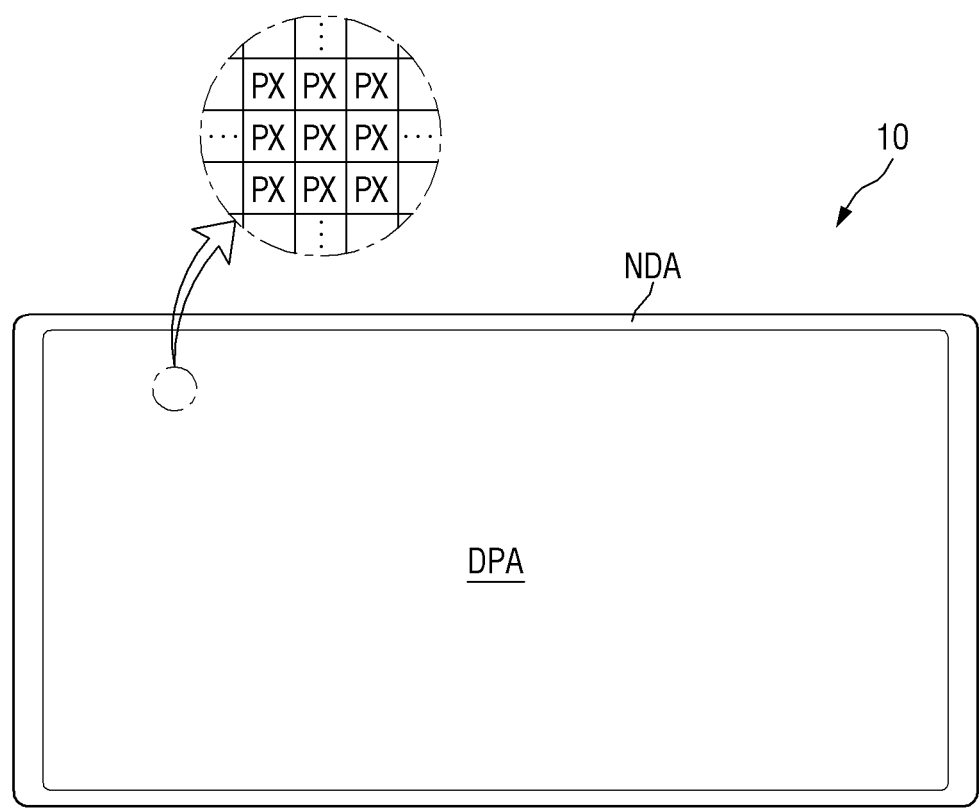
FIG. 1 is a schematic plan view of a display device according to an embodiment.

The present disclosure will now be described more fully hereinafter with reference to the accompanying drawings, in which embodiments of the present disclosure are shown. The embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the present disclosure.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, embodiments of the present disclosure will be described with reference to the attached drawings.

FIG. 1 is a schematic plan view of a display device according to an embodiment.

Referring to FIG. 1, a display device 10 displays a moving image or a still image. The display device 10 may refer to any electronic device that provides a display screen. For example, the display device 10 may be used in televisions, notebooks, monitors, billboards, internet of things (IoTs), mobile phones, smart phones, tablet personal computers (PCs), electronic watches, smart watches, watch phones, head mounted displays, mobile communication terminals, electronic notebooks, electronic books, portable multimedia players (PMPs), navigators, game machines, digital cameras, camcorder, and the like.

The display device 10 includes a display panel for providing a display screen. Examples of the display panel may include an inorganic light emitting diode display panel, an organic light emitting display panel, a quantum dot light emitting display panel, a plasma display panel, and a field emission display panel. Hereinafter, a case in which an inorganic light emitting diode display panel is used as the display panel will be discussed, but the present disclosure is not limited thereto. Any display panel may be used as the display panel as long as the same or similar technical idea is applicable.

The shape of the display device 10 may be variously modified. For example, the display device 10 may have a shape such as a rectangle having longer horizontal sides, a rectangle having longer vertical sides, a square, a rectangle having round corners (e.g., vertexes), another polygon, or a circle. The shape of a display area DPA of the display device 10 may also be similar to the overall shape of the display device 10. FIG. 1 illustrates a display device 10 and a display area DPA each having a rectangular shape having longer horizontal sides.

The display device 10 may include a display area DPA and a non-display area NDA. The display area DPA is an area where an image is displayed, and the non-display area NDA is an area where an image is not displayed. The display area DPA may be referred to as an active area, and the non-display area NDA may be referred to as an inactive area. The display area DPA may generally occupy the center (or the central area) of the display device 10, and the non-display area NDA may surround the display area DPA along the edge or periphery of the display area DPA.

The display area DPA may include a plurality of pixels PX. The plurality of pixels PX may be arranged in a matrix direction. Each of the pixels PX may have a rectangular shape or a square shape in a plan view, but the shape thereof is not limited thereto. Each of the pixels PX may have a rhombus shape in which each side is inclined with respect to one direction. The respective pixels PX may be alternately arranged in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PX is not limited thereto, and the pixels PX may be arranged in the display area DPA in various structures and/or manners. Each of the pixels PX includes at least one light emitting element ED emitting light of a specific wavelength band to display a specific color.

The non-display area NDA may be disposed around the display area DPA along the edge or periphery of the display area DPA. The non-display area NDA may entirely or partially surround the display area DPA. The display area DPA may have a rectangular shape, and the non-display area NDA may be disposed adjacent to four sides of the display area DPA. The non-display area NDA may constitute a bezel of the display device 10. Lines or circuit drivers included in the display device 10 may be disposed in the non-display area NDA, or external devices may be mounted in the non-display area NDA.

Figure 2:
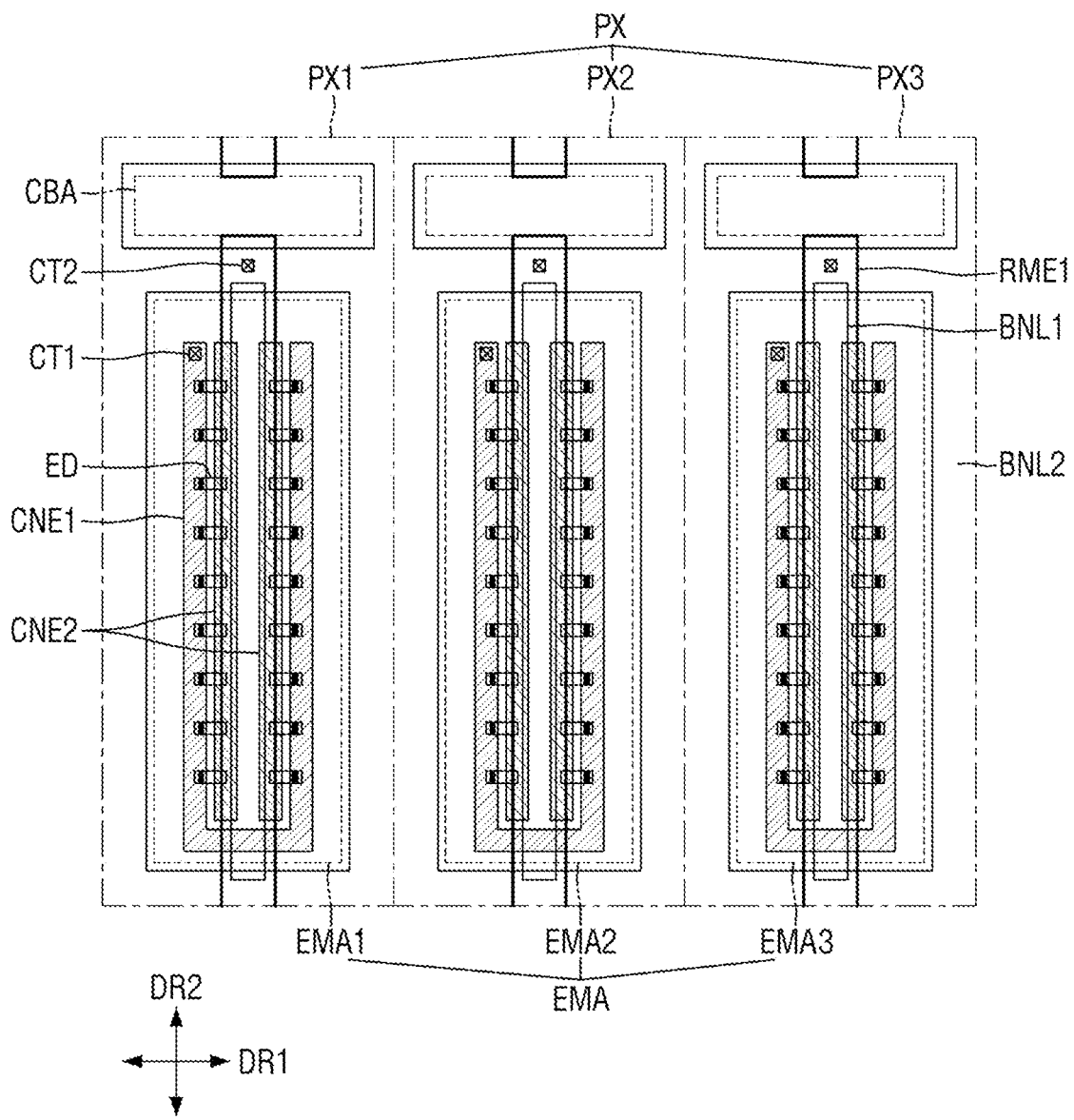
FIG. 2 is a plan view illustrating one pixel of a display device according to an embodiment.

FIG. 2 is a plan view illustrating one pixel of a display device according to an embodiment.

Referring to FIG. 2, each of the pixels PX may include a plurality of sub-pixels PXn (n is an integer of 1 to 3). For example, one pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the present disclosure is not limited thereto, and each of the sub-pixels PXn may emit light of the same color. Although it is shown in FIG. 2 that the pixel PX includes three sub-pixels PXn, the present disclosure is not limited thereto, and the pixel PX may include a larger number of sub-pixels PXn.

Each of the sub-pixels PXn of the display device 10 may include a light emitting area EMA and a non-light emitting area. The light emitting area EMA is defined as an area in which a light emitting element ED is disposed to emit light of a specific wavelength band, and the non-light emitting area is defined as an area in which no light emitting element ED is disposed and no light is emitted. The light emitting area EMA may include an area adjacent to the light emitting element ED to which light emitted from the light emitting element ED is discharged, in addition to an area in which the light emitting element ED is disposed.

However, the present disclosure is not limited thereto, and the light emitting area may also include an area in which light emitted from the light emitting element ED is reflected or refracted by another member and then emitted. The plurality of light emitting elements ED may be arranged in each of the sub-pixels PXn, and the light emitting area may be formed by an area in which the plurality of light emitting elements ED are arranged and an area adjacent to this area.

Although it is illustrated in the drawings that the first light emitting area EMA1 of the first sub-pixel PX1, the second light emitting area EMA2 of the second sub-pixel PX2, and the third light emitting area EMA3 of the third sub-pixel PX3 have substantially uniform areas, the present disclosure is not limited thereto. In some embodiments, the light emitting areas EMA of the first to third sub-pixels PX1, PX2, and PX3 have different areas depending on the color or wavelength band of light emitted from the light emitting element ED disposed in the corresponding sub-pixel.

The non-light emitting area of each of the sub-pixels PXn may include a first area CBA and a second area other than the first area CBA. The first area CBA may be disposed at one side of the light emitting area EMA in the second direction DR2. The first area CBA may be disposed between the light emitting areas EMA of the neighboring sub-pixels PXn in the second direction DR2. That is, a plurality of light emitting areas EMA and a plurality of first areas CBA may be arranged in the display area DPA of the display device 10. For example, the plurality of light emitting areas EMA and the plurality of first areas CBA are repeatedly arranged along the first direction DR1, respectively, and may be alternately arranged along the second direction DR2. A second bank BNL2 is disposed between the first areas CBA and the light emitting areas EMA, and the distance therebetween may be changed depending on the width of the second bank BNL2. Because the light emitting element ED is not disposed in the first area CBA, light is not emitted in the first area CBA, but a part of an electrode RME disposed in each of the sub-pixels PXn may be disposed in the first area CBA. The electrodes RME disposed for some of the sub-pixels PXn may be disposed separately from each other in the first area CBA. However, the present disclosure is not limited thereto, and the electrodes RME may be disposed in a state where they are not separated from each other in the first area CBA. In the non-light emitting area, an area other than the first area CBA is defined as a second area, and may be an area other than the first area CBA and the light emitting area EMA.

Figure 3:
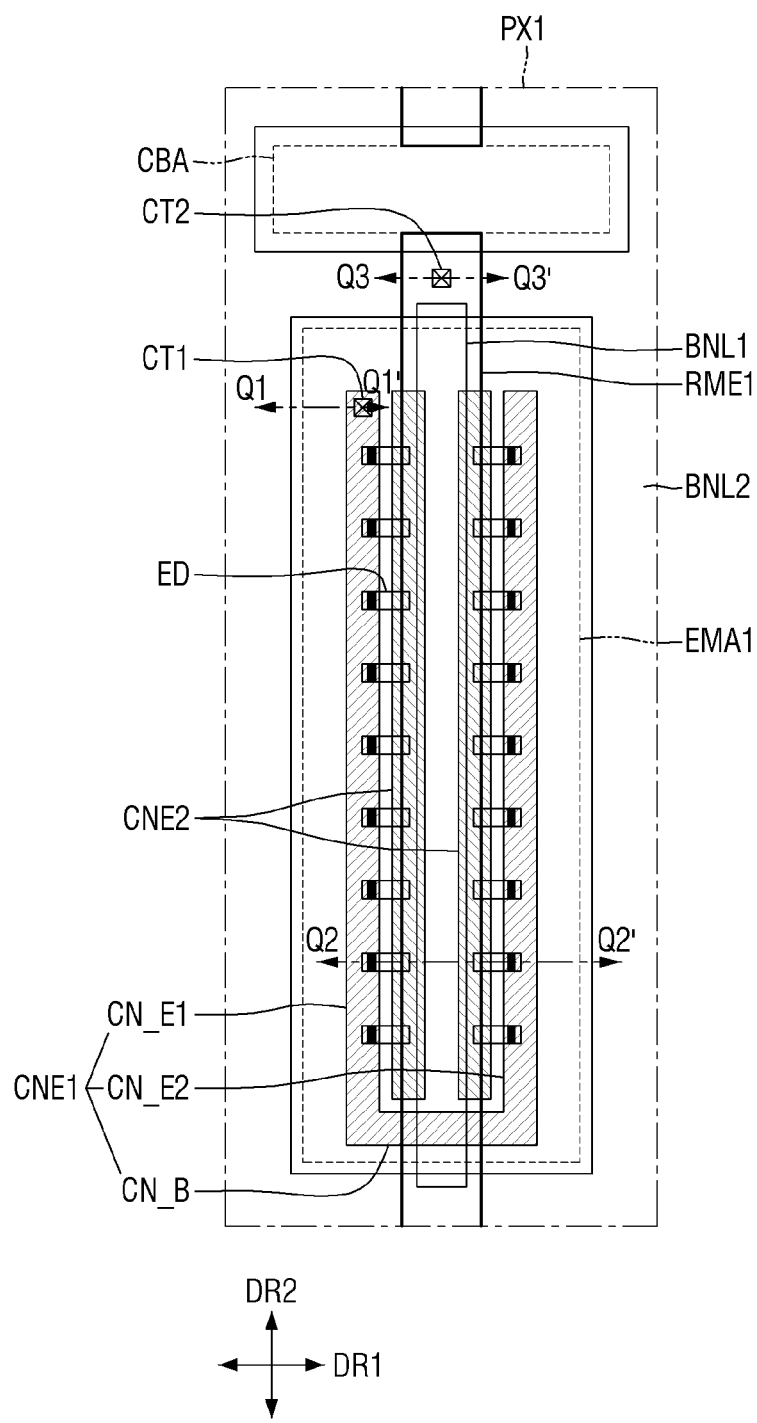
FIG. 3 is a plan view illustrating a first sub-pixel of FIG. 2.
Figure 4:
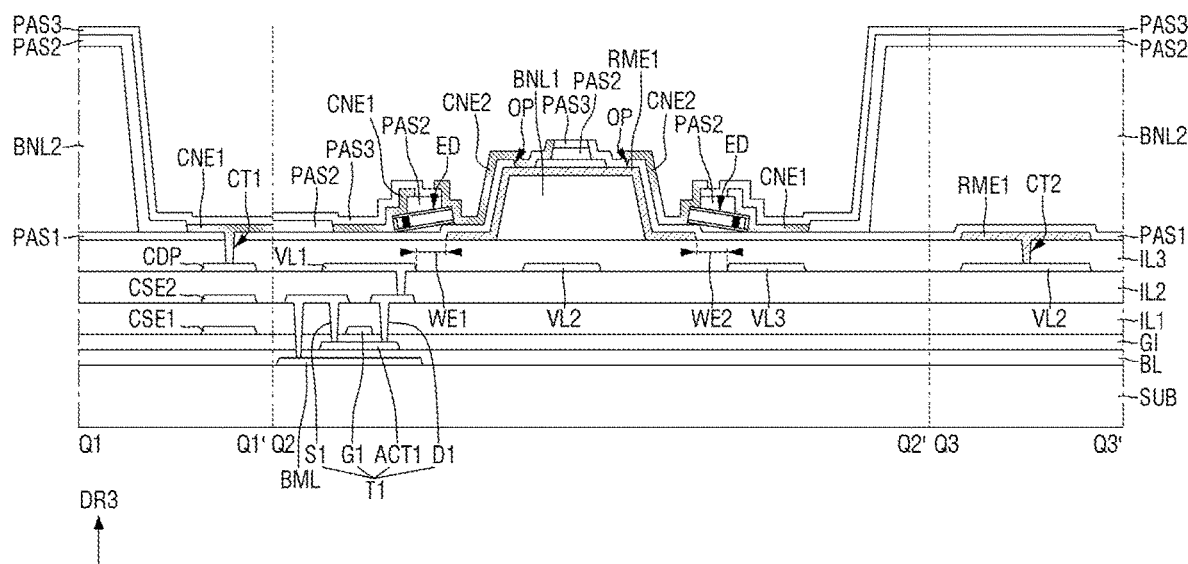
FIG. 4 is a cross-sectional view taken along the lines Q1-Q1', Q2-Q2', and Q3-Q3' of FIG. 3.

FIG. 3 is a plan view illustrating a first sub-pixel of FIG. 2. FIG. 4 is a cross-sectional view taken along the lines Q1-Q1', Q2-Q2', and Q3-Q3' of FIG. 2. FIG. 4 illustrates a cross section across both ends of the light emitting element ED disposed in one sub-pixel PXn.

Referring to FIGS. 3 and 4 together with FIG. 2, the display device 10 may include a first substrate SUB and a semiconductor layer, a plurality of conductive layers, and a plurality of insulating layers, that are disposed on the first substrate SUB. The semiconductor layer, the conductive layers, and the insulating layers may constitute a circuit layer and a light emitting element layer of the display device 10.

The first substrate SUB may be an insulating substrate. The first substrate SUB may be made of an insulating material such as glass, quartz, or polymer resin. The first substrate SUB may be a rigid substrate, but may also be a flexible substrate capable of bending, folding, rolling, or the like.

A first conductive layer BML may be disposed on the first substrate SUB. The first conductive layer BML is disposed to overlap an active layer ACT1 of a first transistor T1 in a thickness direction of the first substrate SUB (e.g., a third direction DR3). The first conductive layer BML may include a material blocking light, thereby preventing light from entering the active layer ACT1 of the first transistor T1. For example, the first conductive layer BML may be formed of an opaque metal material that blocks light transmission. However, the present disclosure is not limited thereto, and in some cases, the first conductive layer BML may be omitted.

A buffer layer BL may be entirely disposed on the first conductive layer BML and the first substrate SUB. The buffer layer BL may be formed on the first substrate SUB to protect the first transistors T1 of the pixel PX from moisture penetrating through the first substrate SUB that is vulnerable to moisture permeation, and may perform a surface planarization function.

A semiconductor layer is disposed on the buffer layer BL. The semiconductor layer may include an active layer ACT1 of the first transistor T1. The semiconductor layer may be disposed to partially overlap a gate electrode G1 or the like of a second conductive layer to be described later in the third direction DR3.

Although in the drawing, only the first transistor T1 from among the transistors included in the sub-pixel PXn of the display device 10 is illustrated, the present disclosure is not limited thereto. The display device 10 may include a larger number of transistors. For example, the display device 10 may include two or three transistors, including one or more transistors in addition to the first transistor T1, for each sub-pixel PXn.

The semiconductor layer may include polycrystalline silicon, monocrystalline silicon, or oxide semiconductor. When the semiconductor layer includes an oxide semiconductor, each active layer ACT1 may include a plurality of conducting regions and a channel region therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), or indium-gallium-zinc-tin oxide (IGZTO).

In another embodiment, the semiconductor layer may include polycrystalline silicon. Polycrystalline silicon may be formed by crystallizing amorphous silicon, and in this case, the conducting regions of the active layer ACT1 may be doped regions doped with impurities.

A first gate insulating layer GI is disposed on the semiconductor layer and the buffer layer BL. The first gate insulating layer GI may be disposed on the semiconductor layer and the buffer layer BL. The first gate insulating layer GI may function as a gate insulating film of each transistor.

A second conductive layer is disposed on the first gate insulating layer GI. The second conductive layer may include a gate electrode G1 of the first transistor T1 and a first capacitive electrode CSE1 of a storage capacitor. The gate electrode G1 may be disposed to overlap the channel region of the active layer ACT1 in the thickness direction of the first substrate SUB (e.g., the third direction DR3). The first capacitive electrode CSE1 may be disposed to overlap a second capacitive electrode CSE2, which will be described later, in the thickness direction of the first substrate SUB (e.g., the third direction DR3). In an embodiment, the first capacitive electrode CSE1 may be integrated with the gate electrode G1.

A first interlayer insulating layer IL1 is disposed on the second conductive layer. The first interlayer insulating layer IL1 may function as an insulating film between the second conductive layer and other layers disposed thereon. The first interlayer insulating layer IL1 may be disposed to cover the second conductive layer to perform a function of protecting the second conductive layer.

A third conductive layer is disposed on the first interlayer insulating layer IL1. The third conductive layer may include a first source electrode S1 and first drain electrode D1 of the first transistor T1, and a second capacitive electrode CSE2.

The first source electrode S1 and first drain electrode D1 of the first transistor T1 may contact the doped regions of the active layer ACT1 through respective contact holes penetrating the first interlayer insulating layer IL1 and the first gate insulating layer GI, respectively. Further, the first source electrode S1 of the first transistor T1 may contact the first conductive layer BML through another contact hole.

The second capacitive electrode CSE2 is disposed to overlap the first capacitive electrode CSE1 in the thickness direction of the first substrate SUB (e.g., the third direction DR3). In an embodiment, the second capacitive electrode CSE2 may be integrally connected to the first source electrode S1. The storage capacitor may be formed between the first capacitive electrode CSE1 and the second capacitive electrode CSE2.

In some embodiments, the third conductive layer may further include a data line for applying a data signal to another transistor. The data line may be connected to source/drain electrodes of another transistor to transmit a signal applied from the data line.

A second interlayer insulating layer IL2 is disposed on the third conductive layer. The second interlayer insulating layer IL2 may function as an insulating film between the third conductive layer and other layers disposed thereon. The second interlayer insulating layer IL2 may be disposed to cover the third conductive layer to perform a function of protecting the third conductive layer.

A fourth conductive layer is disposed on the second interlayer insulating layer IL2. The fourth conductive layer may include a first voltage line VL1, a second voltage line VL2, a third voltage line VL3, and a first conductive pattern CDP. A high-potential voltage (or a first power voltage) supplied to the first transistor T1 may be applied to the first voltage line VL1 connected to the first drain electrode D1 of the first transistor T1, and a low-potential voltage (or a second power voltage) supplied to the first electrode RME1 may be applied to the second voltage line VL2. During the process of manufacturing the display device 10, a suitable voltage (e.g., a set or predetermined voltage) for arranging the light emitting elements ED may be applied to the third voltage line VL3.

The second voltage line VL2 of the fourth conductive layer is disposed at a position partially overlapping with the first electrode RME1 to be described later in the thickness direction of the first substrate SUB (e.g., the third direction DR3), and thus the second voltage line VL2 may disposed so as to traverse the light emitting area EMA. In contrast, the first voltage line VL1 and the third voltage line VL3 may be disposed at a position not overlapping the first electrode RME1 in the thickness direction, and they may be spaced from each other in one direction in a cross-sectional view.

The first conductive pattern CDP may be connected to the second capacitive electrode CSE2, and may be electrically connected to the first transistor T1 through the second capacitive electrode CSE2. The first conductive pattern CDP may contact a first contact electrode CNE1 to be described later, and the first transistor T1 may transmit a first power voltage applied from the first voltage line VL1 to the first contact electrode CNE1. Although it is shown in the drawings that the fourth conductive layer is formed as a separate layer from the underlying third conductive layer, the present disclosure is not limited thereto. In some embodiments, voltage lines of the fourth conductive layer are disposed on the third conductive layer, so that at least one layer may be omitted.

Each of the buffer layer BL, the first gate insulating layer GI, the first interlayer insulating layer IL1, and the second interlayer insulating layer IL2 may be formed of a plurality of inorganic layers alternately stacked. For example, each of the buffer layer BL, the first gate insulating layer GI, the first interlayer insulating layer IL1, and the second interlayer insulating layer IL2 may be formed as double layers in which inorganic layers each including at least one of silicon oxide ($SiO_x$), silicon nitride ($SiN_x$), and silicon oxynitride ($SiO_xN_y$), or as multiple layers in which theses inorganic layers are alternately stacked. However, the present disclosure is not limited thereto, and each of the buffer layer BL, the first gate insulating layer GI, the first interlayer insulating layer IL1, and the second interlayer insulating layer IL2 may also be formed of one inorganic layer including the above-described insulating material.

Further, each of the second conductive layer, the third conductive layer, and the fourth conductive layer may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A third interlayer insulating layer IL3 is disposed on the fourth conductive layer. The third interlayer insulating layer IL3 may include an organic insulating material, for example, an organic material such as polyimide (PI), and may perform a surface planarization function.

A first bank BNL1, a first electrode RME1, a light emitting element ED, a plurality of contact electrodes CNE1 and CNE2, and a second bank BNL2 are arranged on the third interlayer insulating layer IL3, as a display element layer. Further, a plurality of insulating layers PAS1, PAS2, and PAS3 may be disposed on the third interlayer insulating layer IL3.

The first bank BNL1 may be directly disposed on the third interlayer insulating layer IL3. The first bank BNL1 may have a suitable width (e.g., a set or predetermined width) in the first direction DR1 and extend in the second direction DR2 to be disposed in each sub-pixel PXn. The first bank BNL1 is disposed beyond the light emitting area EMA by traversing the center of the light emitting area EMA in the second direction DR2, but may not be disposed in the first area CBA. That is, the length of the first bank BNL1 in the second direction DR2 is larger than the length of the light emitting area EMA in the second direction DR2, so that a part of the first bank BNL1 may be disposed to overlap the second bank BNL2 of the non-light emitting area.

Although it is illustrated in the drawing that one first bank BNL1 is disposed in one sub-pixel PXn to form a linear or stripe pattern, the present disclosure is not limited thereto. In another embodiment, a plurality of first banks BNL1 may be disposed in each sub-pixel PXn, or one first bank BNL1 may be disposed beyond the adjacent sub-pixel PXn. The number of first banks BNL1 disposed in the light emitting area EMA of each sub-pixel PXn may vary according to the number of electrodes RME1 or the arrangement of the light emitting elements ED.

The first bank BNL1 may have a structure in which at least a part thereof protrudes from the upper surface of the third interlayer insulating layer IL3. The protruding portion of the first bank BNL1 may have an inclined side surface, and the light emitted from the light emitting element ED may be reflected from the first electrode RME1 disposed on the first bank BNL1 and emitted in the upward direction of the third interlayer insulating layer IL3. The first bank BNL1 may function as a reflective barrier that reflects light emitted from the light emitting element ED in an upward direction. The side surface of the first bank BNL1 may be inclined in a linear shape, but is not limited thereto, and the first bank BNL1 may have a curved semi-circle or semi-ellipse shape. The first banks BNL1 may include an organic insulating material such as polyimide (PI), but the material thereof is not limited thereto. In some embodiments, the first banks BNL1 may be omitted.

The first electrode RME1 have a shape extending in one direction and are disposed for each sub-pixel PXn. The first electrode RME1 may have a shape extending in the second direction DR2 and may be disposed in the center of the light emitting area EMA. However, the present invention is not limited thereto, in each sub-pixel PXn, a larger number of electrodes may be disposed in addition to the first electrode RME1, and thus the arrangement of the electrodes and the arrangement of the light emitting elements ED may vary.

The first electrode RME1 is disposed in the light emitting area EMA of each sub-pixel PXn, and a part thereof may be disposed to overlap the second bank BNL2 in the thickness direction of the first substrate SUB (e.g., the third direction DR3) beyond the light emitting area EMA. The first electrode RME1 extends in the second direction DR2 within the sub-pixel PXn, but may be spaced from the first electrodes RME1 of another sub-pixel PXn in the second direction DR2 in the first area CBA.

In the arrangement of the first electrodes RME1, electrode lines extending in the second direction DR2 across the adjacent sub-pixels may be formed, and then separated from each other in a subsequent process after the light emitting elements ED are arranged. The electrode lines may be used to generate an electric field in the sub-pixel PXn in order to align the light emitting elements ED during the process of manufacturing the display device 10. For example, when the light emitting elements ED are sprayed on the electrode lines through an inkjet printing process and an ink including the light emitting elements ED is sprayed on the electrode lines, an alignment signal is applied to the electrode lines to generate an electric field. At least one end of the light emitting elements ED dispersed in the ink may be arranged on the first electrodes RME1 by the generated electric field. After the light emitting elements ED are arranged, some of the electrode lines may be separated to form the first electrode RME1 separated for each sub-pixel PXn.

The first electrode RME1 may be electrically connected to the light emitting element ED. The first electrode RME1 may be connected to any one end of the plurality of light emitting elements ED through a second contact electrode CNE2 to be described later, and may transmit an electric signal applied from the fourth conductive layer to the light emitting element ED. However, the present disclosure is not limited thereto, and in some embodiments, the first electrode RME1 and a plurality of other electrodes may not be electrically connected to the light emitting element ED, and may be used only to apply a signal for alignment of the light emitting element ED.

The first electrode RME1 may be disposed to overlap the second voltage line VL2 of the fourth conductive layer in the thickness direction of the first substrate SUB (e.g., the third direction DR3). The first electrode RME1 may be connected to the second voltage line VL2 through a second contact hole CT2 penetrating the third interlayer insulating layer IL3 under the first electrode RME1. The first electrode RME1 is electrically connected to the second voltage line VL2 to apply a second power voltage for light emission of the light emitting element ED. Although it is illustrated in the drawing that the second contact hole CT2 is formed at a position overlapping the second bank BNL2, the present disclosure is not limited thereto. For example, the second contact hole CT2 may be located in the light emitting area EMA surrounded by the second bank BNL2.

According to an embodiment, the first electrode RME1 may be disposed so as not to overlap the first voltage line VL1 and the third voltage line VL3 in a plan view. Both sides of the first electrode RME1 may be spaced from the first voltage line VL1 and the third voltage line VL3, respectively. For example, as the first voltage line VL1 is spaced from one side of the first electrode RME1 in the first direction DR1 in a plan view, their shortest vertical distance from each other may be represented by a first interval WE1.

Further, as the third voltage line VL3 is spaced from the other side of the first electrode RME1 in a plan view, their shortest vertical distance may be represented by a second interval WE2.

The second voltage line VL2 disposed to overlap the first electrode RME1 in the thickness direction of the first substrate SUB (e.g., the third direction DR3) is disposed between the first voltage line VL1 and the third voltage line VL3 to be connected to the first electrode RME1. In contrast, the first voltage line VL1 and the third voltage line VL3 may not be directly connected to the first electrode RME1 or other contact electrodes CNE1 and CNE2 disposed on the third interlayer insulating layer IL3. The first voltage line VL1 may be connected to the first transistor T1, and the first transistor T1 may be electrically connected to a first contact electrode CNE1 to be described later. The first power voltage applied to the first voltage line VL1 may be transmitted to the light emitting elements ED through the first transistor T1 and the first contact electrode CNE1. An electric signal is not applied to the third voltage line VL3 while the display device 10 is driven, and a signal for alignment of the light emitting element ED may be applied together with the first voltage line VL1 during a manufacturing process.

During the process of manufacturing the display device 10, a signal for aligning the light emitting elements ED may be applied to the first electrode RME1. The signal may be applied to a pair of electrodes including other lines or electrodes spaced from the first electrode RME1 to generate an electric field thereon. The display device 10 includes the first voltage line VL1 and the third voltage line VL3 as electrodes or lines forming a pair with the first electrode RME1, and the first voltage line VL1 and the third voltage line VL3 spaced from the first electrode RME1 and not overlapping the first electrode RME1 may be used to apply a signal for alignment of the light emitting elements ED.

In the display device 10 according to an embodiment, signals are applied to the first electrode RME1 disposed on the third interlayer insulating layer IL3 and the first voltage line VL1 and third voltage line VL3 disposed under the third interlayer insulating layer IL3, respectively, to arrange the light emitting elements ED on the third interlayer insulating layer IL3. The first electrode RME1 may be applied with an electric signal different from the first voltage line VL1 and the third voltage line VL3 spaced therefrom, and the electric field generated therebetween may arrange the light emitting elements ED on the first electrode RME1 and the first voltage line VL1 or the third voltage line VL3. The arrangement of the first and third voltage lines VL1 and VL3 and the first electrode RME1 and the alignment of the light emitting elements ED will be described later with reference to other drawings.

The first electrode RME1 may be disposed on the first bank BNL1. The first electrode RME1 may be disposed at least on an inclined side surface of the first bank BNL1. In an embodiment, the width of the first electrode RME1 in the first direction DR1 may be greater than the width of the first bank BNL1 in the first direction DR1, and the first electrode RME1 may be disposed to cover both side surfaces of the first bank BNL1. However, the present disclosure is not limited thereto, and the first electrode RME1 may have a width smaller than that of the first bank BNL1, and may be disposed to cover at least one side surface. The first electrode RME1 is disposed so as to cover at least one side of the first bank BNL1 to reflect light emitted from the light emitting element ED.

The first electrode RME1 may include a conductive material having high reflectance. For example, the first electrode RME1 may include a metal such as silver (Ag), copper (Cu), or aluminum (Al) as the conductive material having high reflectance, or may include an alloy containing aluminum (Al), nickel (Ni), or lanthanum (La). The first electrode RME1 may reflect the light emitted from the light emitting element ED and proceeding to the side surface of the first bank BNL1 in the upward direction of each sub-pixel PXn.

However, the present disclosure is not limited thereto, and the first electrode RME1 may further include a transparent conductive material. For example, the first electrode RME1 may include a material such as indium tin oxide (ITO), indium zinc oxide (IZO), or indium tin zinc Oxide (ITZO). In some embodiments, each of the electrodes RME may have a structure in which one or more transparent conductive material layers and one or more metal layers having high reflectivity are stacked, or may be formed as one layer including them. For example, the first electrode RME1 may have a stacked structure of ITO/Ag/ITO/, ITO/Ag/IZO, or ITO/Ag/ITZO/IZO.

A first insulating layer PAS1 is disposed on the first electrode RME1 and the third interlayer insulating layer IL3. The first insulating layer PAS1 may be disposed to cover the first bank BNL1 and the first electrode RME1, and may be disposed to expose a part of the upper surface of the first electrode RME1. An opening OP exposing the upper surface of a portion disposed on the first bank BNL1, among the upper surfaces of the first electrodes RME1, may be formed in the first insulating layer PAS1, and some of the contact electrodes CNE1 and CNE2 may contact the first electrode RME1 through the opening OP. The first insulating layer PAS1 may protect the first electrode RME1 and prevent or protect the light emitting element ED from being damaged by direct contact with other members.

Although it is illustrated in the drawing that the openings OP are formed in parallel with both ends of the light emitting element ED in the first direction DR1, the present disclosure is not limited thereto. In some embodiments, the openings OP of the first insulating layer PAS1 may be disposed so as not to overlap the light emitting elements ED in the first direction DR1. For example, the opening OP may be formed to be spaced from an area in which the plurality of light emitting elements ED are arranged along the second direction DR2. Light is emitted from both ends of the light emitting element ED, and the opening OP may be placed so as to deviate from the traveling path of the light. The opening OP of the first insulating layer PAS1 may be formed in the first area CBA in which the light emitting elements ED are not arranged. The contact electrodes CNE1 and CNE2 (to be described later) may be disposed across the light emitting area EMA and the first area CBA, and may contact the electrode RME exposed through the opening OP formed in the first area CBA and the light emitting elements ED disposed in the light emitting area EMA.

A second bank BNL2 may be disposed on the first insulating layer PAS1. The second bank BNL2 may be disposed in a lattice pattern on the entire surface of the display area DPA while including portions extending in the first direction DR1 and the second direction DR2 on a plane. The second bank BNL2 may be disposed over the boundary of the respective sub-pixels PXn to distinguish neighboring sub-pixels PXn. Further, the second bank BNL2 may be disposed to surround the light emitting area EMA and the first area CBA disposed for each sub-pixel PXn to distinguish the light emitting area EMA and the first area CBA. In the portion of the second bank BNL2 extending in the second direction DR2, the portion disposed between the adjacent light emitting areas EMA may have a greater width than the portion disposed between the adjacent first areas CBA. Accordingly, the distance (e.g., in the first direction DR1) between the adjacent first areas CBA may be smaller than the distance (e.g., in the first direction DR1) between the adjacent light emitting areas EMA.

The second bank BNL2 may be formed to have a greater height than the first bank BNL1. The second bank BNL2 may prevent ink from overflowing to adjacent sub-pixels PXn in an inkjet printing process of the process of manufacturing the display device 10, so that inks in which different light emitting elements 30 are dispersed for each pixel PXn may be separated from each other and therefore not to be mixed with each other. The second bank BNL2, like the first bank BNL1, may include polyimide (P1), but the material thereof is not limited thereto.

The light emitting element ED may be disposed on the first insulating layer PAS1. The plurality of light emitting elements ED may be arranged to be spaced from each other along the second direction DR2 in which the first electrode RME1 or the first voltage line VL1 and the third voltage line VL3 extend, and may be aligned substantially in parallel to each other. The light emitting element ED may have a shape extending in one direction (e.g., the first direction DR1), and a direction (e.g., the second direction DR2) in which the first electrode RME1 extends may be substantially perpendicular to a direction in which the light emitting element ED extends. However, the present disclosure is not limited thereto, and the light emitting element ED may be disposed obliquely at a suitable angle (e.g., a set or predetermined angle) without being perpendicular to the direction in which the first electrode RME1 extends.

The light emitting element ED may include semiconductor layers doped with different conductivity types of dopants. The light emitting element ED may include a plurality of semiconductor layers, and may be aligned such that one end of the light emitting element ED faces a specific direction according to the direction of an electric field generated between the first electrode RME1 and the first voltage line VL1 or the third voltage line VL3. The light emitting element ED may include a light emitting layer ("36" in FIG. 7) to emit light of a specific wavelength band. The light emitting elements ED disposed in each sub-pixel PXn may emit light of different wavelength bands according to the material constituting the light emitting layer 36. However, the present disclosure is not limited thereto, and the light emitting elements ED disposed in each of the sub-pixels PXn may emit light of the same color.

The light emitting element ED may be provided with a plurality of layers arranged along a direction parallel to the upper surface of the first substrate SUB. The light emitting element ED of the display device 10 is disposed such that one extending direction is parallel to the first substrate SUB, and the plurality of semiconductor layers included in the light emitting element ED may be sequentially arranged along a direction parallel to the upper surface of the first substrate SUB. However, the present disclosure is not limited thereto. In some cases, when the light emitting element ED has a different structure, the plurality of semiconductor layers may be arranged along a direction perpendicular to of the first substrate SUB.

In an embodiment, at least one end of the light emitting element ED may be disposed on the first electrode RME1. For example, the light emitting element ED may be disposed such that both ends thereof is placed on the first electrode RME1 and the first voltage line VL1 or the third voltage line VL3. Because the first voltage line VL1 and the third voltage line VL3 are disposed to be respectively spaced from both sides of the first electrode RME1, one end of the plurality of light emitting elements ED may be placed on the first electrode RME1, and may be disposed on both sides of the first electrode RME1. Because the light emitting element ED has a shape extending in one direction (e.g., the first direction DR1), it may include a first end and a second end opposite to the first end. In an embodiment including only one first electrode RME1, the first end of the light emitting element ED may be disposed so as not to overlap the first electrode RME1 in the thickness direction of the first substrate SUB (e.g., a third direction DR3), and the second end thereof may be disposed on the first electrode RME1. When the first and second intervals WE1 and WE2 that are the shortest vertical distances between the first electrode RME1 and the first voltage line VL1 and the first electrode RME1 and the third voltage line VL3, respectively, are shorter than the length of the light emitting element ED, the first end of the light emitting element ED may be placed on the first voltage line VL1 or the third voltage line VL3. However, the present disclosure is not limited thereto, and when the first interval WE1 and the second interval WE2 are longer than the length of the light emitting element ED, the light emitting element ED may be disposed such that the first end is disposed in an area between the first electrode RME1 and the first voltage line VL1 or the third voltage line VL3.

Both ends of the light emitting element ED are directly disposed on the first insulating layer PAS1, but only one end is placed on the first electrode RME1. Therefore, the light emitting element ED may be obliquely disposed due to the step of the first insulating layer PAS1 in a cross-sectional view. However, the present disclosure is not limited thereto.

According to one or more embodiments, both ends of the light emitting element ED may contact the contact electrodes CNE1 and CNE2, respectively. Because the light emitting element ED may not be provided with an insulating film ("38" in FIG. 7) on the extending end surface in one direction, and a part of the semiconductor layer or a part of the electrode layer may be exposed, the exposed semiconductor layer may contact the contact electrodes CNE1 and CNE2. However, the present disclosure is not limited thereto. In some cases, at least a part of the insulating film 38 may be removed, so that both side surfaces of the semiconductor layers (e.g., both ends of the light emitting element ED) may be partially exposed. The exposed side surfaces of the semiconductor layers (e.g., both ends of the light emitting element ED) may directly contact the contact electrodes CNE1 and CNE2.

A second insulating layer PAS2 may be partially disposed on the first insulating layer PAS1 and the light emitting element ED. For example, the second insulating layer PAS2 may be disposed to partially surround the outer surface of the light emitting element ED not to cover one end and the other end of the light emitting element ED. Further, the second insulating layer PAS2 may also be disposed on the first bank BNL1 and the second bank BNL2. That is, the second insulating layer PAS2 is disposed on the light emitting element ED and is also disposed on the first insulating layer PAS1 and the second bank BNL2 in the light emitting area EMA, but may be disposed to expose a part of the portion where the first electrode RME1 is disposed together with both ends of the light emitting element ED. The shape of the second insulating layer PAS2 may be formed by a process of entirely placing the second insulating layer PAS2 on the first insulating layer PAS1 and the second bank BNL2 and then removing the second insulating layer PAS2 to expose both ends of the light emitting element ED during the process of manufacturing the display device 10.

A portion of the second insulating layer PAS2, the portion being disposed on the light emitting element ED, may be disposed to extend in the second direction DR2 on the first insulating layer PAS1 on the plane, thereby forming a linear or island-shaped pattern in each sub-pixel PXn. The second insulating layer PAS2 may protect the light emitting element ED and fix the light emitting element ED in the process of manufacturing the display device 10. The second insulating layer PAS2 may be disposed to fill the space between the light emitting element ED and the first insulating layer PAS1 under the light emitting element ED.

The plurality of contact electrodes CNE1 and CNE2 and the third insulating layer PAS3 may be disposed on the second insulating layer PAS2. The contact electrodes CNE1 and CNE2 may include a first contact electrode CNE1 contacting the first end of both ends of the light emitting element ED and not connected to the first electrode RME1, and at least one second contact electrode CNE2 contacting the second end of both ends of the light emitting element ED and connected to the first electrode RME1. The first contact electrode CNE1 and the second contact electrode CNE2 may contact respective ends of the light emitting element ED. For example, the semiconductor layer may be exposed to both end surfaces of the light emitting element ED, and the first contact electrode CNE1 and the second contact electrode CNE2 may contact the light emitting element ED on the end surface where the semiconductor layer is exposed.

The first contact electrode CNE1 may be disposed on the first ends of the light emitting elements ED to contact the first ends thereof. The first contact electrode CNE1 may be disposed on the first ends of the light emitting elements ED disposed on both sides of the first electrode RME1. In an embodiment, the first contact electrode CNE1 may include a first extension portion CN_E1 and a second extension portion CN_E2 extending in the second direction DR2, and a connection portion CN_B extending in the first direction DR1 and connecting the first extension portion CN_E1 and the second extension portions CN_E2. The first extension portion CN_E1 may be disposed on first ends of the light emitting elements ED disposed at the left side of the first electrode RME1 in the first direction DR1. The second extension portion CN_E2 may be disposed on the first ends of the light emitting elements ED disposed at the right side of the first electrode RME1. The connection portion CN_B does not cover the light emitting elements ED, and may connect the first extension portion CN_E1 and the second extension portion CN_E2 to each other. In an embodiment, the connection portion CN_B is disposed under (or below) the light emitting area EMA in the second direction DR2 not to contact the light emitting elements ED, but to connect the extension portions.

The second contact electrode CNE2 may be disposed on the first electrode RME1 and may have a shape extending in the second direction DR2. The second contact electrode CNE2 may be disposed on the second ends of the light emitting elements ED disposed on the first electrode RME1 to contact the second ends thereof. Because the light emitting elements ED are disposed on both sides of the first electrode RME1, a plurality of second contact electrodes CNE2, for example, two second contact electrodes CNE2, are provided in one sub-pixel PXn. However, the present disclosure is not limited thereto, and only one second contact electrode CNE2 may be provided in each sub-pixel PXn. Each of the second contact electrodes CNE2 may contact the first electrode RME1 exposed through the opening OP formed in the first insulating layer PAS1. The second contact electrode CNE2 may be connected to the second voltage line VL2 through the first electrode RME1 and may transmit a second power voltage to the second ends of the light emitting elements ED.

According to an embodiment, the first contact electrode CNE1 may be connected to the first conductive pattern CDP through the first contact hole CT1 penetrating the first insulating layer PAS1 and the third interlayer insulating layer IL3. The first extension portion CN_E1 of the first contact electrode CNE1 may contact the first conductive pattern CDP through the first contact hole CT1 formed in the light emitting area EMA. Unlike the second contact electrode CNE2, the first contact electrode CNE1 may be electrically connected to the first transistor T1 under the first electrode RME1 without passing through the first electrode RME1. The first power voltage applied to the first voltage line VL1 may be transmitted to the first ends of the light emitting elements ED through the first transistor T1 and the first contact electrode CNE1.

Although it is shown in the drawing that one first contact electrode CNE1 and two second contact electrodes CNE2 are provided in one sub-pixel PXn, the present disclosure is not limited thereto. The number of first and second contact electrodes CNE1 and CNE2 may vary depending on the number of electrodes disposed in each sub-pixel PXn.

The contact electrodes CNE1 and CNE2 may include a conductive material. For example, the contact electrodes CNE1 and CNE2 may include ITO, IZO, ITZO, or aluminum (Al). For example, the contact electrodes CNE1 and CNE2 may include a transparent conductive material, and light emitted from the light emitting element ED may pass through the contact electrodes CNE1 and CNE2 and travel toward the electrode RME1. However, the present disclosure is not limited thereto.

A third insulating layer PAS3 may be disposed between the first contact electrode CNE1 and the second contact electrode CNE2. The third insulating layer PAS3 may also be disposed on the second insulating layer PAS2 and the first contact electrode CNE1 except for an area where the second contact electrode CNE2 is disposed. The third insulating layer PAS3 may be entirely disposed on the first insulating layer PAS1 and the second insulating layer PAS2 except for a portion where the second contact electrode CNE2 is disposed, on the first electrode RME1. The third insulating layer PAS3 may insulate the first contact electrode CNE1 and the second contact electrode CNE2 from each other such that they do not directly contact each other. That is, in an embodiment, the first contact electrode CNE1 and the second contact electrode CNE2 may be disposed on different layers. The first contact electrode CNE1 may be directly disposed on the second insulating layer PAS2, and the second contact electrode CNE2 may be disposed directly on the third insulating layer PAS3. However, the first contact electrode CNE1 and the second contact electrode CNE2 may not be disposed on the second insulating layer PAS2 and the third insulating layer PAS3, and may be directly disposed on the first insulating layer PAS1 in an area where both ends of the light emitting element ED are exposed.

The third insulating layer PAS3 may be disposed between the first contact electrode CNE1 and the second contact electrode CNE2 to insulate them from each other, but as described above, the third insulating layer PAS3 may be omitted. In this case, the first contact electrode CNE1 and the second contact electrode CNE2 may be disposed on the same layer.

Although not shown in the drawings, an insulating layer may be further disposed on the second insulating layer PAS2, the third insulating layer PAS3, and the contact electrodes CNE1 and CNE2 to cover them. The insulating layer may be disposed entirely on the first substrate SUB to protect members disposed thereon from an external environment.

Each of the above-described first insulating layer PAS1, second insulating layer PAS2, and third insulating layer PAS3 may include an inorganic insulating material or an organic insulating material. In an embodiment, each of the first insulating layer PAS1, the second insulating layer PAS2, and the third insulating layer PAS3 may include an inorganic insulating material such as silicon oxide (SiOx), silicon nitride (SiNx), silicon oxynitride (SiOxNy), aluminum oxide ($Al_xO_y$), or aluminum nitride (AlNx). Alternatively, each of the first insulating layer PAS1, the second insulating layer PAS2, and the third insulating layer PAS3 may include an organic insulating material such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the present disclosure is not limited thereto.

Figure 5:
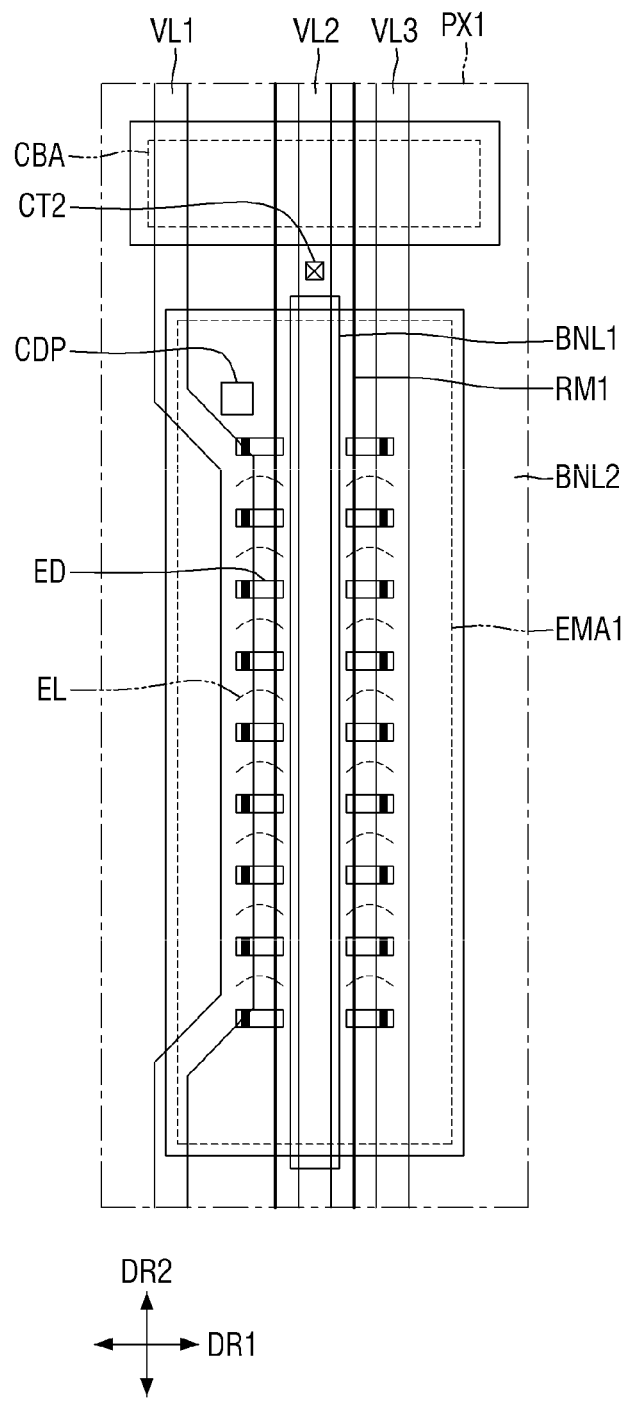
FIG. 5 is a plan view illustrating the arrangement of voltage lines and the alignment of light emitting elements of a display device according to an embodiment.
Figure 6:
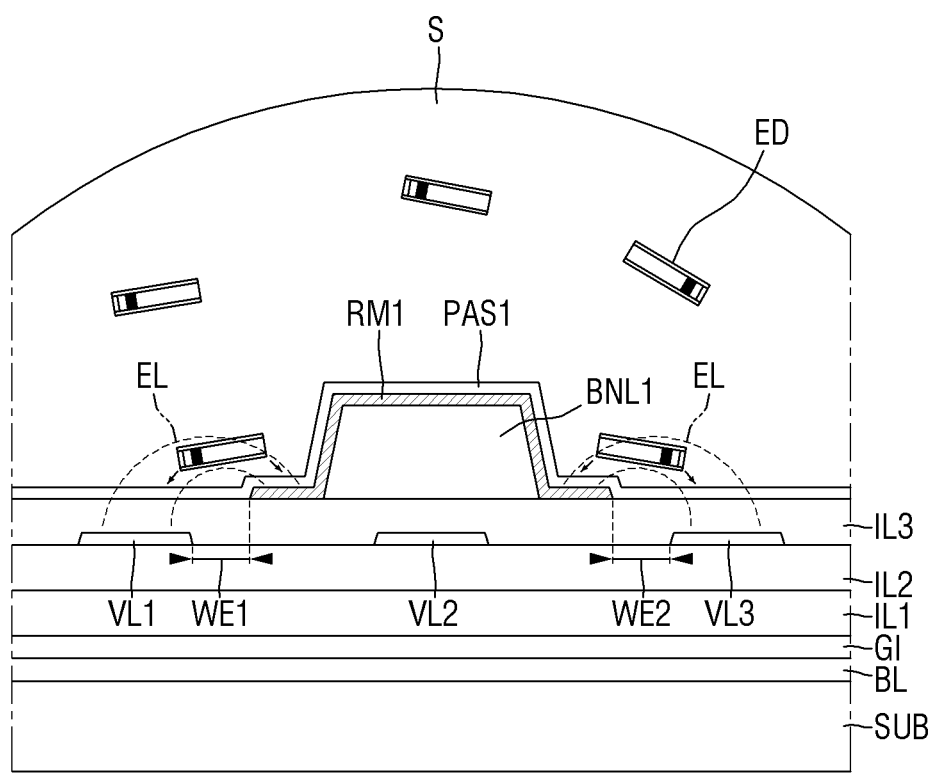
FIG. 6 is a cross-sectional view illustrating the arrangement of voltage lines and the alignment of light emitting elements of FIG. 5.

FIG. 5 is a plan view illustrating the arrangement of voltage lines and the alignment of light emitting elements of a display device according to an embodiment. FIG. 6 is a cross-sectional view illustrating the arrangement of voltage lines and the alignment of light emitting elements of FIG. 5. FIG. 5 illustrates the schematic planar arrangement of a first bank BNL1, a plurality of voltage lines VL1, VL2, and VL3, and a first electrode line RM1, arranged in a first sub-pixel PX1. FIGS. 5 and 6 illustrate the arrangement of the light emitting elements ED using voltage lines VL1, VL2, and VL3 and the first electrode line RM1.

Referring to FIGS. 5 and 6, voltage lines VL1, VL2, and VL3 of the fourth conductive layer may be arranged to extend in a second direction DR2 in a plan view. The first voltage line VL1 may extend from the boundary of the sub-pixel PXn in the second direction DR2, and may be disposed such that a partially bent portion is located in the light emitting area EMA. The second voltage line VL2 and the third voltage line VL3 may be disposed to extend in the second direction DR2 and traverse the light emitting area EMA. However, the present disclosure is not limited thereto, and other voltage lines may not necessarily extend only in the second direction DR2, and may be partially bent.

In the display device 10, after ink S including light emitting elements ED is sprayed into the light emitting area EMA of each sub-pixel PXn, an electric field EL is generated on the first electrode line RM1 to arrange the light emitting elements ED. During the process of manufacturing the display device 10, a first electrode line RM1 extending in the second direction DR2 is disposed in each sub-pixel PXn. The first electrode line RM1 may extend beyond the light emitting area EMA and the first area CBA, and the sub-pixels PXn adjacent in the second direction DR2 may share one first electrode line RM1. The first electrode line RM1 may be cut in the first area CBA after forming the second insulating layer PAS2 for arranging and fixing the light emitting elements ED. The first electrode line RM1 may be divided into a plurality of first electrodes RME1 disposed for each sub-pixel PXn.

In an embodiment, the light emitting elements ED are prepared in a state dispersed in the ink S, and the light emitting elements ED may be sprayed onto the light emitting area EMA of each sub-pixel PXn by an inkjet printing process. When the ink S including the light emitting element ED is sprayed on the first electrode line RM1, alignment signals are applied to some of the first electrode line RM1 and the voltage lines VL1, VL2, and VL3 to generate an electric field EL on the first electrode line RM1.

The first electrode line RM1 may extend in the second direction DR2 to be disposed in a pad area located in the plurality of non-display areas NDA. The first to third voltage lines VL1, VL2, and VL3 may also extend in the second direction DR2 to be disposed in the pad area. The first electrode line RM1 and the plurality of voltage lines VL1, VL2, and VL3 may be each connected to an external device in a pad area to apply an alignment signal.

According to an embodiment, the display device 10 may apply an alignment signal to at least the first electrode line RM1, the first voltage line VL1, and the third voltage line VL3 to arrange the light emitting elements ED. The first electrode line RM1 and the second voltage line VL2 may be connected to each other through the second contact hole CT2, and alignment signals having the same sign may be applied to each of the first electrode line RM1 and the second voltage line VL2. Alignment signals having the same sign as the first electrode line RM1 are individually applied to the second voltage line VL2, or the alignment signals applied only to the first electrode line RM1 may be transmitted to the second voltage line VL2 through the second contact hole CT2. Alignment signals having different signs (e.g., polarities) from the first electrode line RM1 may be applied to the first voltage line VL1 and the third voltage line VL3. An electric field EL may be generated between the electrode line and the voltage line to which the alignment signals of different signs (e.g., polarities) are applied. For example, an electric field EL in a specific direction may be generated between the first electrode line RM1 and the first voltage line VL1 and between the first electrode line RM1 and the third voltage line VL3.

Even when the first electrode RME1 or the first electrode line RM1 and the first and third voltage lines VL1 and VL3 are disposed at different layers, they may be spaced so as not to overlap each other in the thickness direction of the first substrate SUB (e.g., the third direction DR3). The shortest vertical distance between the first electrode line RM1 and the first voltage line VL1 may be represented by a first interval WE1 in a cross-sectional view. The shortest vertical distance between the first electrode line RM1 and the third voltage line VL3 may be represented by a second interval WE2 in a cross-sectional view. Even if the electrode line and voltage line are arranged on different layers, when the alignment signals are applied in a state in which they are spaced from each other by a suitable distance (e.g., a set or predetermined distance), an electric field EL may be generated between the electrode line and the voltage line. The light emitting element ED including semiconductor layers doped with different conductivity types may have intramolecular dipoles, and the light emitting elements ED may have at least one end disposed on the first electrode line RM1 while changing their position and alignment direction by receiving a dielectrophoretic force by the electric field EL.

Because alignment signals of the same sign (or polarity) are applied to the first electrode line RM1, a specific end, for example, the second end of the light emitting elements ED may be disposed on the first electrode line RM1. In an embodiment, in the light emitting element ED disposed on the first voltage line VL1 and the first electrode line RM1, directions in which the first end or the second end faces may be opposite to each other, with respect to the light emitting elements ED disposed on the third voltage line VL3 and the first electrode line RM1.

In the light emitting elements ED disposed on the first insulating layer PAS1, the second insulating layer PAS2 may be formed in a subsequent process, and thus the positions at which the light emitting elements ED are arranged may be fixed. Then, because a first contact electrode CNE1 and a second contact electrode CNE2 are formed, both ends of the plurality of light emitting elements ED may be electrically connected to the first voltage line VL1 and the second voltage line VL2.

In the display device, because the electrode lines and voltage lines disposed on different layers are used compared to the case of arranging the light emitting elements ED using a plurality of electrode lines disposed on the third interlayer insulating layer IL3, an area required to form the light emitting area of each sub-pixel PXn may be reduced or minimized. Because the first voltage line VL1 and third voltage line VL3 used to align the light emitting elements ED are disposed under the second bank BNL2, even if they overlap the second bank BNL2 in the thickness direction of the first substrate SUB (e.g., the third direction DR3), an electric field EL may be generated in the light emitting area EMA. For example, when one electrode line and voltage lines under the electrode line are used, the distance between the electrode line and the voltage line may not be restricted by the length of the light emitting element ED. For example, the first interval WE1, which is the shortest vertical distance between the first electrode line RM1 and the first voltage line VL1, may be set regardless of the length of the light emitting element ED. The magnitude relationship between the first interval WE1 and the length of the light emitting element ED only determines whether the light emitting element ED and the first voltage line VL1 overlap each other in the thickness direction of the first substrate SUB (e.g., the third direction DR3). Further, the light emitting elements ED emit light through connection with the contact electrodes CNE1 and CNE2, so that the magnitude relationship may be completely irrelevant to the light emission of the light emitting element ED. Because it is not restricted to adjusting the interval between electrode lines than the case of using the plurality of electrode lines disposed on the same layer, a short between adjacent electrode lines or an unstable arrangement of the light emitting elements ED may not be problematic.

Further, even when only one first electrode line RM1 or first electrode RME1 is disposed on the third interlayer insulating layer IL3, light emitting elements ED may be disposed on both sides of the first electrode line RM1, so that it is possible to secure the same light emitting area as that using the three electrode lines. That is, the display device 10 according to an embodiment may have a feature that a suitable number (e.g., a set or predetermined number) of light emitting elements ED may be arranged without limitation in the area of the light emitting area EMA, and it may be possible to implement a high-resolution display device with a large light emitting area EMA or high luminance with respect to the unit area.

Figure 7:
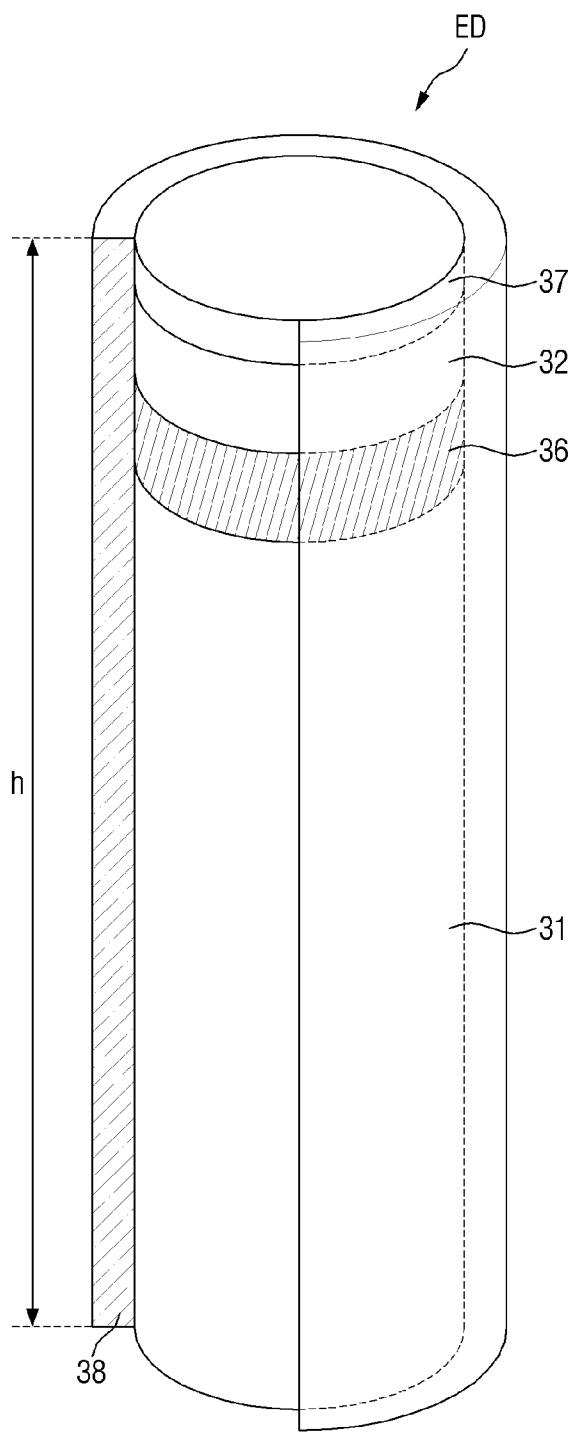
FIG. 7 is a schematic view of a light emitting element according to an embodiment.

FIG. 7 is a schematic view of a light emitting element according to an embodiment.

The light emitting element ED may be a light emitting diode. For example, the light emitting element ED may be an inorganic light emitting diode having a size of a micrometer or a nanometer and made of an inorganic material. When an electric field is formed between two electrodes facing each other in a direction (e.g., a set or predetermined direction), the organic light emitting diode may be aligned between the two electrodes having different polarities. The light emitting element ED may be aligned between the two electrodes by the electric field formed between the two electrodes.

The light emitting element ED may have a shape extending in one direction. The light emitting element ED may have a shape of a cylinder, a rod, a wire, or a tube. However, the shape of the light emitting element ED is not limited thereto, and the light emitting element ED may have various shapes such as a cube, a cuboid, and a hexagonal column, or may have a shape extending in the one direction and having partially inclined outer surface. A plurality of semiconductors included in the light emitting element ED to be described later may be sequentially arranged or stacked in one direction.

The light emitting element ED may include semiconductor layers doped with any conductive type (for example, p-type or n-type) impurity. The semiconductor layers may receive an electrical signal applied from an external power source and emit light of a specific wavelength band.

Referring to FIG. 7, the light emitting element ED may include a first semiconductor layer 31, a second semiconductor layer 32, a light emitting layer 36, an electrode layer 37, and an insulating film 38.

The first semiconductor layer 31 may be an n-type semiconductor layer. When the light emitting element ED emits light of a blue wavelength band, the first semiconductor layer 31 may include a semiconductor material having a chemical formula of $Al_xGa_yIn_{1-x-y}N$ ($0\le x\le 1$, $0\le y\le 1$, $0\le x+y\le 1$). For example, the semiconductor material of the first semiconductor layer 31 may be at least one of AlGaInN, GaN, AlGaN, InGaN, AlN, and InN, each being doped with n-type impurities. The first semiconductor layer 31 may be doped with an n-type dopant. The n-type dopant may be Si, Ge, or Sn. For example, the first semiconductor layer 31 may be n-GaN doped with n-type Si. The length of the first semiconductor layer 31 may be 1.5 μm to 5 μm, but is not limited thereto. In some embodiments, the first end of the light emitting element ED may be a portion of the light emitting element ED at a side of the light emitting layer 36 on which the first semiconductor layer 31 is disposed.

The second semiconductor layer 32 is disposed on the light emitting layer 36 to be described later. The second semiconductor layer 32 may be a p-type semiconductor layer. When the light emitting element ED emits light of a blue wavelength band or a green wavelength band, the second semiconductor layer 32 may include a semiconductor material having a chemical formula of $Al_xGa_yIn_{1-x-y}N$ ($0\le x\le 1$, $0\le y\le 1$, $0\le x+y\le 1$). For example, the semiconductor material of the second semiconductor layer 32 may be at least one of AlGaInN, GaN, AlGaN, InGaN, AlN, and InN, each being doped with p-type impurities. The second semiconductor layer 32 may be doped with a p-type dopant. The p-type dopant may be Mg, Zn, Ca, Se, or Ba. For example, the second semiconductor layer 32 may be p-GaN doped with p-type Mg. The length of the second semiconductor layer 32 may be in a range of 0.05 μm to 0.10 μm, but is not limited thereto. In some embodiments, the second end of the light emitting element ED may be a portion of the light emitting element ED at a side of the light emitting layer 36 on which the second semiconductor layer 32 is disposed.

Although it is shown in FIG. 4 that each of the first semiconductor layer 31 and the second semiconductor layer 32 is formed as one layer, the present disclosure is not limited thereto. Each of the first semiconductor layer 31 and the second semiconductor layer 32 may further include a larger number of layers, for example, clad layers or tensile strain barrier reducing (TSBR) layers according to the material of the light emitting layer 36.

The light emitting layer 36 is disposed between the first semiconductor layer 31 and the second semiconductor layer 32. The light emitting layer 36 may include a material of a single or multiple quantum well structure. When the light emitting layer 36 includes a material of a multiple quantum well structure, the light emitting layer 36 may have a structure in which quantum layers and well layers are alternately stacked. The light emitting layer 36 may emit light by the combination of electron-hole pairs according to an electrical signal applied through the first semiconductor layer 31 and the second semiconductor layer 32. When the light emitting layer 36 emits light of a blue wavelength band, the light emitting layer 36 may include a material such as AlGaN or AlGaInN. For example, when the light emitting layer 36 has a multiple quantum well structure in which quantum layers and well layers are alternately stacked, the quantum layers may include a material such as AlGaN or AlGaInN, and the well layers may include a material such as GaN or AlInN. For example, the light emitting layer 36 includes quantum layers each containing AlGaInN and well layers each containing AlInN, and thus the light emitting layer 36 may emit blue light having a central wavelength band of 450 nm to 495 nm as described above.

However, the present disclosure is not limited thereto, and the light emitting layer 36 may have a structure in which semiconductor materials having high bandgap energy and semiconductor materials having low bandgap energy are alternately stacked, and may include other Group III to Group V semiconductor materials depending on the wavelength band of light. The light emitted from the light emitting layer 36 is not limited to light of a blue wavelength band, and in some cases, the light emitting layer 36 may emit light of a red or green wavelength band. The length of the light emitting layer 36 may be in a range of 0.05 μm to 0.10 μm, but is not limited thereto.

In some embodiments, the light emitted from the light emitting layer 36 may be emitted to both side surfaces of the light emitting element ED as well as the longitudinal outer surface of the light emitting element ED. The direction of the light emitted from the light emitting layer 36 is not limited to one direction.

The electrode layer 37 may be an ohmic contact electrode. However, the present disclosure is not limited thereto, and the electrode layer 37 may be a Schottky contact electrode. The light emitting element ED may include at least one electrode layer 37. Although it is shown in FIG. 7 that the light emitting element ED includes one electrode layer 37, the present disclosure is not limited thereto. In some cases, the light emitting element ED may include a larger number of electrode layers 37, or the electrode layer 37 may be omitted. A description of the light emitting element ED to be described later may be equally applied even if the number of electrode layers 37 is changed or the light emitting element ED further includes other structures.

When the light emitting element ED is electrically connected to an electrode or a contact electrode in the display device 10 according to an embodiment, the electrode layer 37 may reduce resistance between the light emitting element ED and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities. However, the present disclosure is not limited thereto.

The insulating film 38 is disposed to surround the outer surfaces (e.g., outer peripheral surfaces) of the above-described semiconductor layers and electrode layers. For example, the insulating film 38 may be disposed to surround at least the outer surface (e.g., the outer peripheral surface) of the light emitting layer 36, and may extend in one direction in which the light emitting element ED extends. The insulating film 38 may function to protect the members (e.g., the semiconductor layers 31 and 32 and the light emitting layer 36 of the light emitting element ED). For example, the insulating film 38 may be formed to surround the side surfaces of the members, and may be formed such that both ends of the light emitting element ED in a length direction are exposed.

Although it is shown in FIG. 7 that the insulating film 38 may extend in the length direction of the light emitting element ED to cover the first semiconductor layer 31 to the side surface of the electrode layer 37, the present disclosure is not limited thereto. The insulating film 38 may cover only the outer surface (e.g., the outer peripheral surface) of a part of the semiconductor layer as well as the light emitting layer 36 or cover only a part of the outer surface (e.g., the outer peripheral surface) of the electrode layer 37 to expose a part of the outer surface of the electrode layer 37. The insulating film 38 may be formed to have a cross-sectional upper surface in an area adjacent to at least one end of the light emitting element ED.

The thickness of the insulating film 38 may be in a range of 10 nm to 1.0 μm, but is not limited thereto. In some embodiments, the thickness of the insulating film 38 may be about 40 nm.

The insulating film 38 may include a material having insulating properties, for example, silicon oxide (SiOx), silicon nitride (SiNx), silicon oxynitride (SiOxNy), aluminum nitride ($AlN_x$), or aluminum oxide ($Al_xO_y$). Although it is shown in the drawing, the insulating layer 38 is formed as a single layer, the present disclosure is not limited thereto. In some embodiments, the insulating film 38 may be formed to have a multi-layer structure in which a plurality of layers are stacked. Thus, the light emitting layer 36 may be prevented from an electrical short that may occur when the light emitting layer 36 is in direct contact with an electrode through which an electrical signal is transmitted to the light emitting element ED. Further, because the insulating film 38 protects the outer surface (e.g., the outer peripheral surface) of the light emitting element ED as well as the light emitting layer 36, it is possible to prevent the deterioration of light emission efficiency.

Further, the outer surface (e.g., the outer peripheral surface) of the insulating film 38 may be surface-treated. The light emitting elements ED may be aligned by being sprayed onto the electrodes in a state in which they are dispersed in a suitable ink (e.g., a set or predetermined ink). Here, the surface of the insulating film 38 may be hydrophobically or hydrophilically treated in order to maintain the light emitting elements ED in a dispersed state without being aggregated with other adjacent light emitting elements ED in the ink. For example, the outer surface (e.g., the outer peripheral surface) of the insulating film 38 may be surface-treated with a material such as stearic acid or 2,3-naphthalene dicarboxylic acid.

The length h of the light emitting element ED may be in a range of 1 μm to 10 μm or 2 μm to 6 μm, and in some embodiments, in a range of 3 μm to 5 μm. The diameter of the light emitting element ED may be in a range of 30 nm to 700 nm, and the aspect ratio of the light emitting element ED may be in a range of 1.2 to 100. However, the present disclosure is not limited thereto, and the plurality of light emitting elements ED included in the display device 10 may have different diameters according to the composition difference of the light emitting layer 36. In some embodiments, the diameter of the light emitting element ED may be about 500 nm.

Hereinafter, another embodiment of the display device 10 will be described with reference to other drawings.

Figure 8:
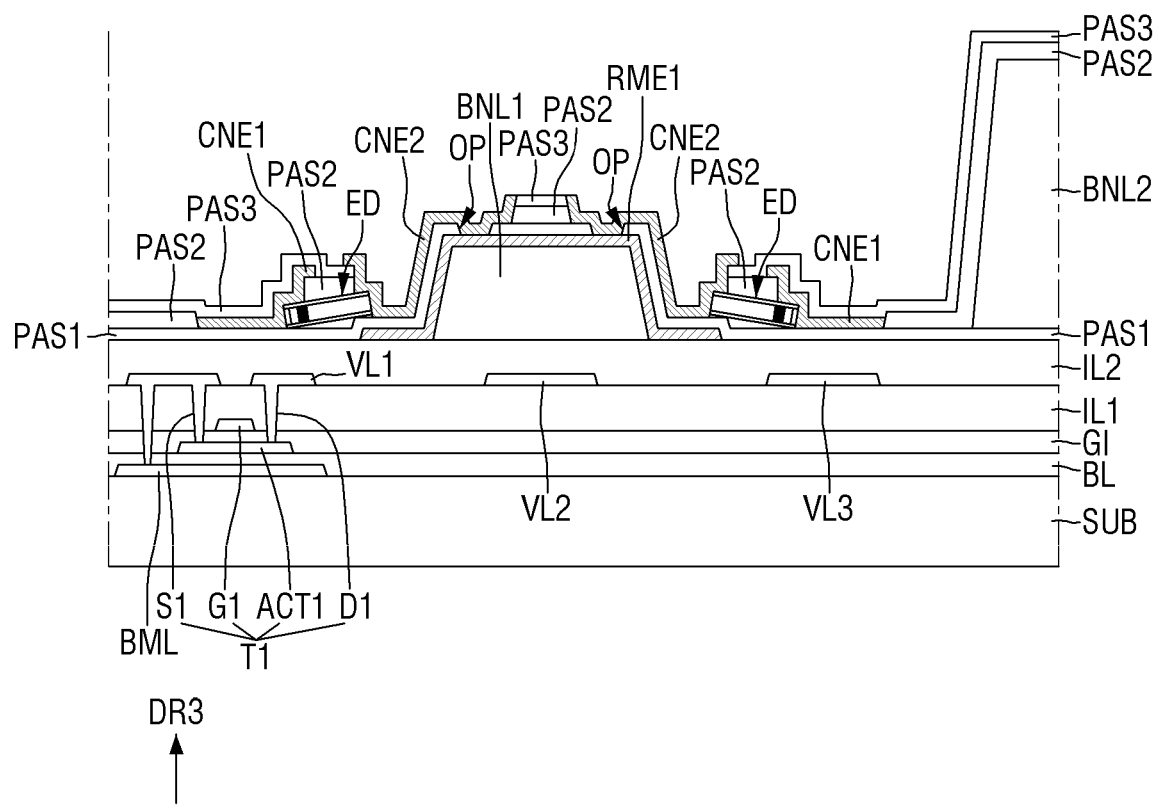
FIG. 8 is a partial cross-sectional view of a display device according to another embodiment.

FIG. 8 is a partial cross-sectional view of a display device according to another embodiment.

Referring to FIG. 8, the plurality of voltage lines VL1, VL2, and VL3 are formed of the third conductive layer, and the third interlayer insulating layer IL3 may be omitted. The first voltage line VL1, the second voltage line VL2, and the third voltage line VL3 may be each directly disposed on the first interlayer insulating layer IL1, and the first electrode RME1, the first bank BNL1, and the first insulating layer PAS1 may be directly disposed on the second interlayer insulating layer IL2. That is, the first voltage line VL1, the second voltage line VL2, and the third voltage line VL3 may be disposed on the same layer as the source electrode S1 of the first transistor T1. The first voltage line VL1 may be integrated with the drain electrode D1 of the first transistor T1. Further, the first contact electrode CNE1 may be directly connected to the second capacitive electrode CSE2, not the first conductive pattern CDP. Because the arrangement of the first to third voltage lines VL1, VL2, and VL3 with the first electrode RME1 disposed thereon is relatively free, a design that avoids other lines arranged on the third conductive layer is possible. In the display device 10 of the present embodiment, because the fourth conductive layer and the third interlayer insulating layer IL3 are omitted, the total number of manufacturing processes may be decreased.

Figure 9:
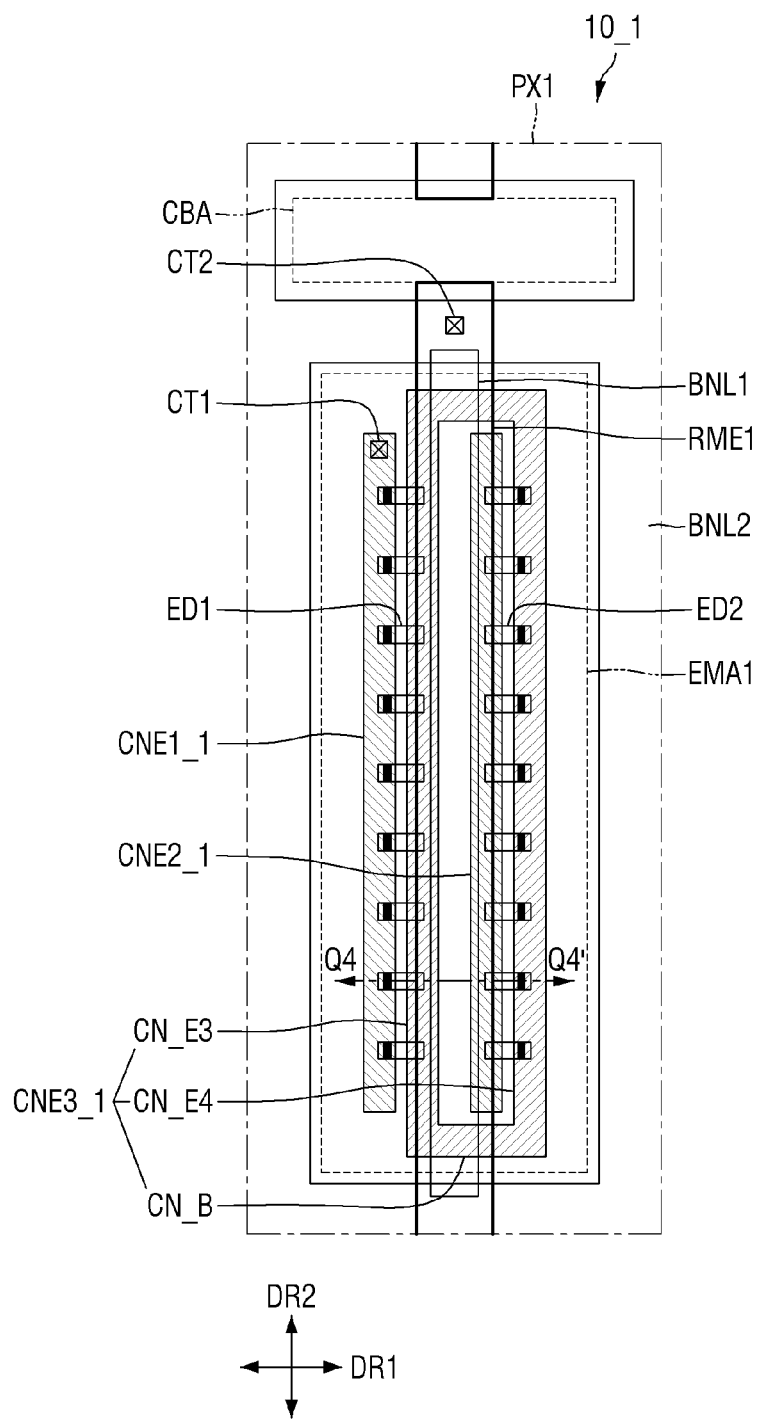
FIG. 9 is a plan view illustrating one sub-pixel of a display device according to another embodiment.
Figure 10:
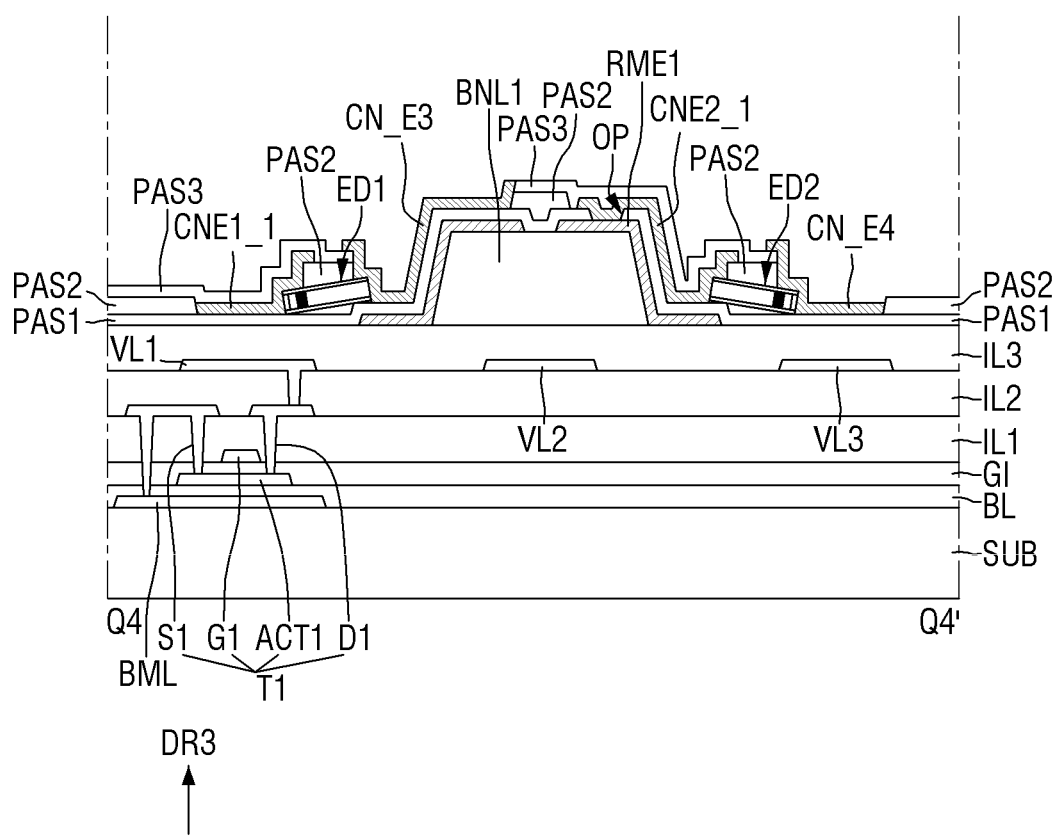
FIG. 10 is a cross-sectional view taken along the line Q4-Q4' of FIG. 9.

FIG. 9 is a plan view illustrating one sub-pixel of a display device according to another embodiment. FIG. 10 is a cross-sectional view taken along the line Q4-Q4' of FIG. 9.

Referring to FIGS. 9 and 10, a display device 10_1 according to an embodiment may further include a third contact electrode CNE3_1 contacting one end and the other end of the plurality of light emitting elements ED in addition to the first contact electrode CNE1_1 and second contact electrode CNE2_1 each having a shape extending in one direction (e.g., the second direction DR2). The light-emitting element ED may include first light emitting elements ED1 and second light-emitting elements ED2 respectively arranged on both sides of the first electrode RME1. The display device 10_1 according to the present embodiment is different in that the first light emitting elements ED1 and the second light emitting elements ED2 are connected to each other through the third contact electrode CNE3_1.

For example, in the first light emitting element ED1, the first end thereof is disposed on the first voltage line VL1 or between the first voltage line VL1 and the first electrode RME1, and the second end thereof is disposed on the first electrode RME1. In the second light emitting element ED2, the first end thereof is disposed on the third voltage line VL3 or between the first electrode RME1 and the third voltage line VL3, and the second end thereof is disposed on the first electrode RME1. In the first light emitting element ED1 and the second light emitting element ED2, directions in which the first end faces may be opposite to each other. The first light emitting element ED1 is a light emitting element disposed by an electric field generated between the first voltage line VL1 and the first electrode RME1, and the second light emitting element ED2 may be a light emitting element disposed by an electric field generated between the third voltage line VL3 and the first electrode RME1.

The first contact electrode CNE1_1 extends in the second direction DR2 and is disposed on the first ends of the first light emitting elements ED1. Because the first contact electrode CNE1_1 has a shape including only the first extension portion CN_E1, the first contact electrode CNE1_1 may be disposed so as not to overlap the first electrode RME1. The first contact electrode CNE1_1 may be electrically connected to the first transistor T1 through the first contact hole CT1 and may contact the first ends of the first light emitting elements ED1.

The second contact electrode CNE2_1 extends in the second direction DR2 and is disposed on the second end of the second light emitting elements ED2 and one side of the first electrode RME1. Because the second contact electrode CNE2_1 is disposed on the first electrode RME1 and contacts the first electrode RME1, the second contact electrode CNE2_1 may be electrically connected to the second voltage line VL2 and may contact the second ends of the second light emitting elements ED2.

The third contact electrode CNE3_1 may be disposed on the second end of the first light emitting element ED1 and the first end of the second light emitting element ED2. The third contact electrode CNE3_1 may include a third extension portion CN_E3 and a fourth extension portion CN_E4 extending in the second direction DR2, and a connection portion CN_B extending in the first direction DR1 to connect the third extension portion CN_E3 and the fourth extension portion CN_E4. The third extension portion CN_E3 may be disposed on the first electrode RME1 to contact the second ends of the first light emitting elements ED1. The fourth extension portion CN_E4 may be disposed to be in contact with the first ends of the second light emitting elements ED2. The connection portions CN_B may be arranged to connect the third extension portion CN_E3 and the fourth extension portion CN_E4, and the third contact electrode CNE3_1 may have a shape surrounding the second contact electrode CNE2_1 in a plan view.

The third contact electrode CNE3_1 may not contact the first electrode RME1 through the opening OP, even if the third extension portion CN_E3 is disposed on the first electrode RME1. Unlike other contact electrodes, the third contact electrode CNE3_1 may not be directly connected to the first electrode RME1 or fourth conductive layer thereunder, but may be connected only to the light emitting elements ED1 and ED2. Accordingly, the electric signal transmitted to the first light emitting element ED1 may flow to the second light emitting element ED2 through the third contact electrode CNE3_1, and the first light emitting element ED1 and the second light emitting element ED2 may be connected in series. Because the display device 10_1 according to an embodiment further includes a third contact electrode CNE3_1 contacting only the light emitting elements ED1 and ED2, the same number of light emitting elements ED1 and ED2 (e.g., as in the display device 10 of FIG. 3) may be connected in series, and the luminance per unit area of each sub-pixel PXn may be further improved.

In the embodiment of FIGS. 9 and 10, the display device 10_1 may further include the third contact electrode CNE3_1 to have a two-series structure in which the first light emitting element ED1 and the second light emitting element ED2 are connected in series with each other. However, the present disclosure is not limited thereto, and the display device 10 may include a larger number of contact electrodes compared to the display device 10_1, and thus the light emitting elements of each sub-pixel PXn may have more series structures.

Figure 11:
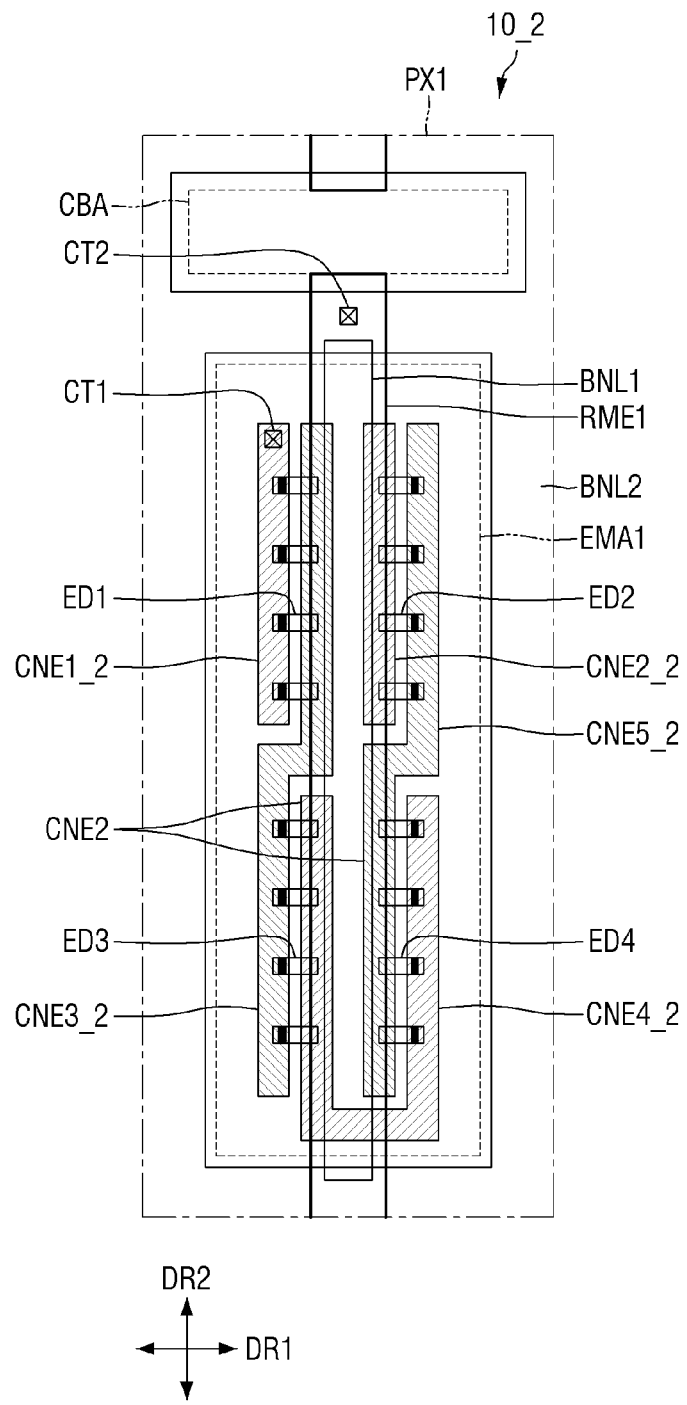
FIG. 11 is a plan view illustrating one sub-pixel of a display device according to another embodiment.

FIG. 11 is a plan view illustrating one sub-pixel of a display device according to another embodiment.

Referring to FIG. 11, a display device 10_2 may include a greater number of contact electrodes to constitute the light emitting elements ED with more series connection. The display device 10_2 may further include third and fourth light-emitting elements ED3 and ED4, where one of the two ends of each of the third and fourth light-emitting elements ED3 and ED4 contacts a third contact electrode CNE3_2, a fourth contact electrode CNE4_2, or a fifth contact electrode CNE5_2. In addition, the display device 10_2 may include the first light emitting element ED1 having the first end contacting the first contact electrode CNE1_2 and the second light emitting element ED2 having the second end contacting the second contact electrode CNE2_2. The first to fourth light emitting elements ED1, ED2, ED3, and ED4 may be connected to each other through the third to fifth contact electrodes CNE3_2, CNE4_2, and CNE5_2 that are not connected to the first transistor T1 or the second voltage line VL2, and may be connected in series with each other.

For example, the first to fourth light emitting elements ED1 to ED4 have second ends disposed on the first electrode RME1. The first light emitting element ED1 and the third light emitting element ED3 are light emitting elements disposed by an electric field generated between the first electrode RME1 and the first voltage line VL1, and may be disposed such that their first ends face a direction opposite to the first direction DR1. In other words, the first ends of the first and third light emitting elements ED1 and ED3 are located in a direction opposite to the first direction DR1 along a length of the light emitting element ED from their respective second ends. The second light emitting element ED2 and the fourth light emitting element ED4 are light emitting elements disposed by an electric field generated between the first electrode RME1 and the third voltage line VL3, and may be disposed such that their first ends face the first direction DR1. In other words, the first ends of the second and fourth light emitting elements ED2 and ED4 are located in the first direction DR1 along a length of the light emitting element ED from their respective second ends. The first light emitting element ED1 and the second light emitting element ED2 may be disposed over (or above) the center (or the central region) of the light emitting area EMA, and the third light emitting element ED3 and the fourth light emitting element ED4 may be disposed under (or below) the center (or the central region) of the light emitting area EMA. However, the first light emitting element ED1 and the third light emitting element ED3, and the second light emitting element ED2 and the fourth light emitting element ED4 may be classified according to the type of contact electrode contacting both ends thereof, and may not be clearly distinguished from each other through their arrangement positions.

The first contact electrode CNE1_2 is disposed on the first end of the first light emitting element ED1. The first contact electrode CNE1_2 may extend in the second direction DR2 but may have a shorter length than that of other embodiments, and may not be disposed on the first end of the third light emitting element ED3. The second contact electrode CNE2_2 is disposed on the second end of the second light emitting element ED2 and on one side of the first electrode RME1. The second contact electrode CNE2_2 may also extend in the second direction DR2 but may have a shorter length, and may not be disposed on the second end of the fourth light emitting element ED4. The first contact electrode CNE1_2 and the second contact electrode CNE2_2 are different from those of the above embodiments in that their lengths are relatively short.

The third contact electrode CNE3_2 may be disposed on the second end of the first light emitting element ED1 and the first end of the third light emitting element ED3. The third contact electrode CNE3_2 may extend in the second direction DR2 and may have a partially bent shape. The extension portions of the third contact electrode CNE3_2 that contact any one end of the light emitting element ED may be staggered so as to be offset from each other along the first direction DR1. A portion of the third contact electrode CNE3_2 that contacts the second end of the first light emitting element ED1 and disposed thereon, may be disposed on the other side of the first electrode RME1, and may not contact the first electrode RME1. A portion of the third contact electrode CNE3_2 that contacts the first end of the third light emitting element ED3 and disposed thereon, may not overlap the first electrode RME1, may be aligned along the second direction DR2 with the first contact electrode CNE1_2, and may be spaced from the first contact electrode CNE1_2 in the second direction DR2. The third contact electrode CNE3_2 may contact the second end of the first light emitting element ED1 and the first end of the third light emitting element ED3 to connect them in series.

The fourth contact electrode CNE4_2 may be disposed on the second end of the third light emitting element ED3 and the first end of the fourth light emitting element ED4. The fourth contact electrode CNE4_2 may have a similar shape as the first contact electrode CNE1 of FIG. 3 and may be disposed under (or below) the light emitting area EMA. A portion of the fourth contact electrode CNE4_2 that contacts the second end of the third light emitting element ED3 and disposed thereon, may be disposed on the other side of the first electrode RME1, and may not contact the first electrode RME1. A portion of the fourth contact electrode CNE4_2 that contacts the first end of the fourth light emitting element ED4 and disposed thereon, may not overlap the first electrode RME1. The fourth contact electrode CNE4_2 may have a shape surrounding (or a shape that is around) a portion of the fifth contact electrode CNE5_2 that is disposed on the first electrode RME1. The fourth contact electrode CNE4_2 may contact the second end of the third light emitting element ED3 and the first end of the fourth light emitting element ED4 to connect them in series.

The fifth contact electrode CNE5_2 may be disposed on the second end of the fourth light emitting element ED4 and the first end of the second light emitting element ED2. The fifth contact electrode CNE5_2 may have the same shape as the third contact electrode CNE3_2. A portion of the fifth contact electrode CNE5_2 that contacts the second end of the fourth light emitting element ED4 and disposed thereon, may be disposed on the other side of the first electrode RME1, and may not contact the first electrode RME1. A portion of the fifth contact electrode CNE5_2 that is disposed on the first electrode RME1, may be aligned along the second direction DR2 with the second contact electrode CNE2_2, and may be spaced from the second contact electrode CNE2_2 in the second direction DR2. A portion of the fifth contact electrode CNE5_2 that is disposed on the first end of the second light emitting element ED2, may not overlap the first electrode RME1, and may be aligned along the second direction DR2 with a part of the fourth contact electrode CNE4_2. The fifth contact electrode CNE5_2 may contact the second end of the fourth light emitting element ED4 and the first end of the second light emitting element ED2 to connect them in series.

Because the display device 10_2 according to the present embodiment includes a larger number of contact electrodes, the light emitting elements ED disposed in one sub-pixel PXn may be connected in a 4-series configuration. In the display device 10_2, a large number of light emitting elements ED may be disposed with only one first electrode RME1 disposed on the third interlayer insulating layer IL3, and this arrangement may be desirable to secure a space in which the third to fifth contact electrodes CNE3_2, CNE4_2, and CNE5_2 are bent or bypassed. Accordingly, the luminance per unit area of the sub-pixel PXn may be further improved as a number of light emitting elements ED are connected in series by designing the shape and arrangement of the contact electrodes.

Figure 12:
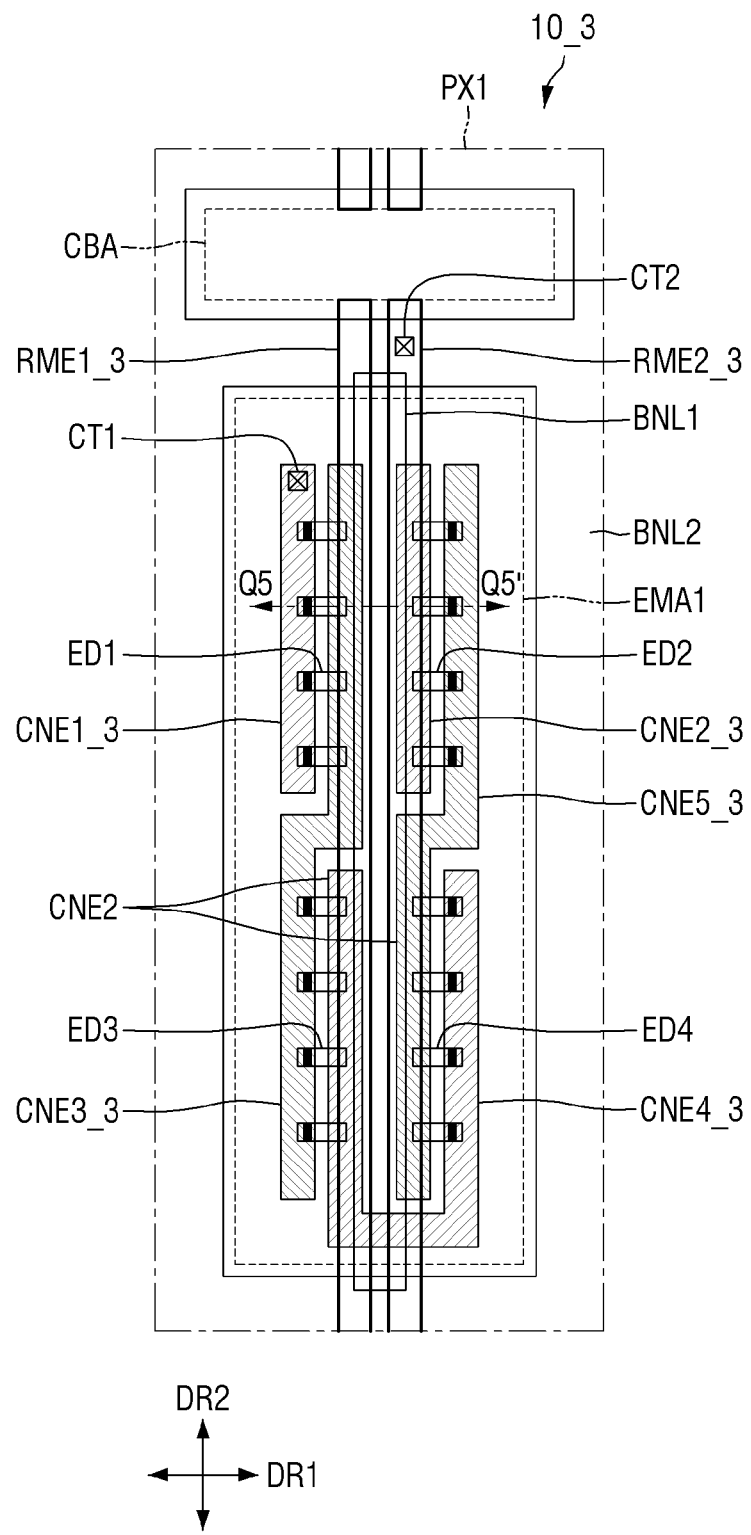
FIG. 12 is a plan view illustrating one sub-pixel of a display device according to another embodiment.
Figure 13:
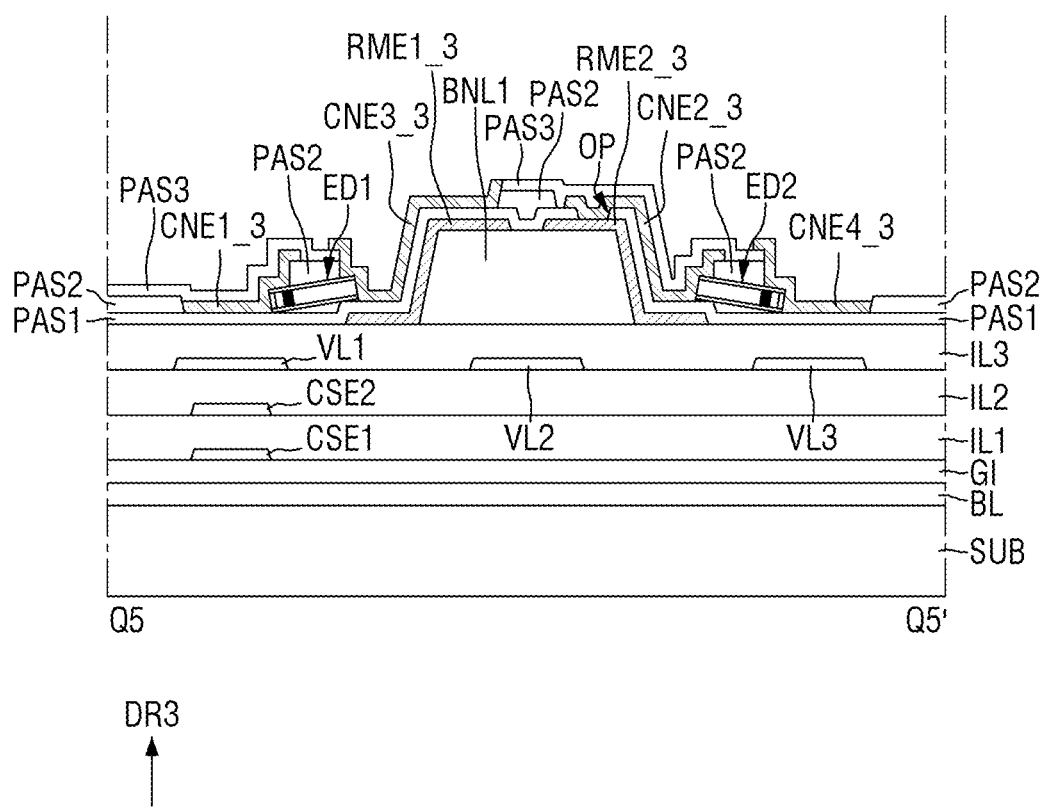
FIG. 13 is a cross-sectional view taken along the line Q5-Q5' of FIG. 12.

FIG. 12 is a plan view illustrating one sub-pixel of a display device according to another embodiment. FIG. 13 is a cross-sectional view taken along the line Q5-Q5' of FIG. 12.

Referring to FIGS. 12 and 13, a display device 10_3 may include a larger number of electrodes RME1_3 and RME2_3. The display device 10_3 may include a first electrode RME1_3 disposed on the other side of the first bank BNL1 in the first direction DR1 and a second electrode RME2_3 disposed on one side of the first bank BNL1 in the first direction DR1. The present embodiment is different from the embodiment of FIG. 11 in that in the display device 10_3, one first electrode RME1 is separated into a first electrode RME1_3 and a second electrode RME2_3 spaced from each other. Hereinafter, redundant description will be omitted, and the shapes of the electrodes RME1_3 and RME2_3 will be described.

The first electrode RME1_3 and the second electrode RME2_3 may be disposed to be spaced from each other in the first direction DR1 on the first bank BNL1. The first electrode RME1_3 and the second electrode RME2_3 may be disposed to cover only both sides of the first bank BNL1 as the width thereof in the first direction DR1 is smaller than that of the first bank BNL1. The first voltage line VL1 may be spaced from the first electrode RME1_3, and the third voltage line VL3 may be spaced from the second electrode RME2_3.

The first light emitting element ED1 and the third light emitting element ED3 may have second ends disposed on the first electrode RME1_3, and the second light emitting element ED2 and the fourth light emitting element ED4 may have second ends disposed on the second electrode RME2_3. The first contact electrode CNE1_3 and the third contact electrode CNE3_3 may be in contact with the first ends of the light-emitting elements ED (e.g., ED1 and ED3) disposed by the electric field generated between the first voltage line VL1 and the first electrode RME1_3. The fourth contact electrode CNE4_3 and the fifth contact electrode CNE5_3 may be in contact with the first ends of the light emitting elements ED (e.g., ED4 and ED2) disposed by the electric field generated between the third voltage line VL3 and the second electrode RME2_3. The second contact electrode CNE2_3 may be disposed on the second electrode RME2_3 to contact the second end of the second light emitting element ED2.

The second contact hole CT2 for contacting the second voltage line VL2 may be formed only on the second electrode RME2_3. The first electrode RME1_3 may not be connected to the conductive layer under the first electrode RME1_3, and may be disposed in a floating state without contacting the contact electrodes on the first electrode RME1_3.

Even when the first electrode RME1_3 and the second electrode RME2_3 are disposed to be separated from each other, the light emitting element ED may not be disposed on the first electrode RME1_3 and the second electrode RME2_3. During the process of manufacturing the display device 10_3, each of the electrodes RME1_3 and RME2_3 may be formed as an electrode line extending in the second direction DR2, and an alignment signal having the same sign may be applied thereto.

Figure 14:
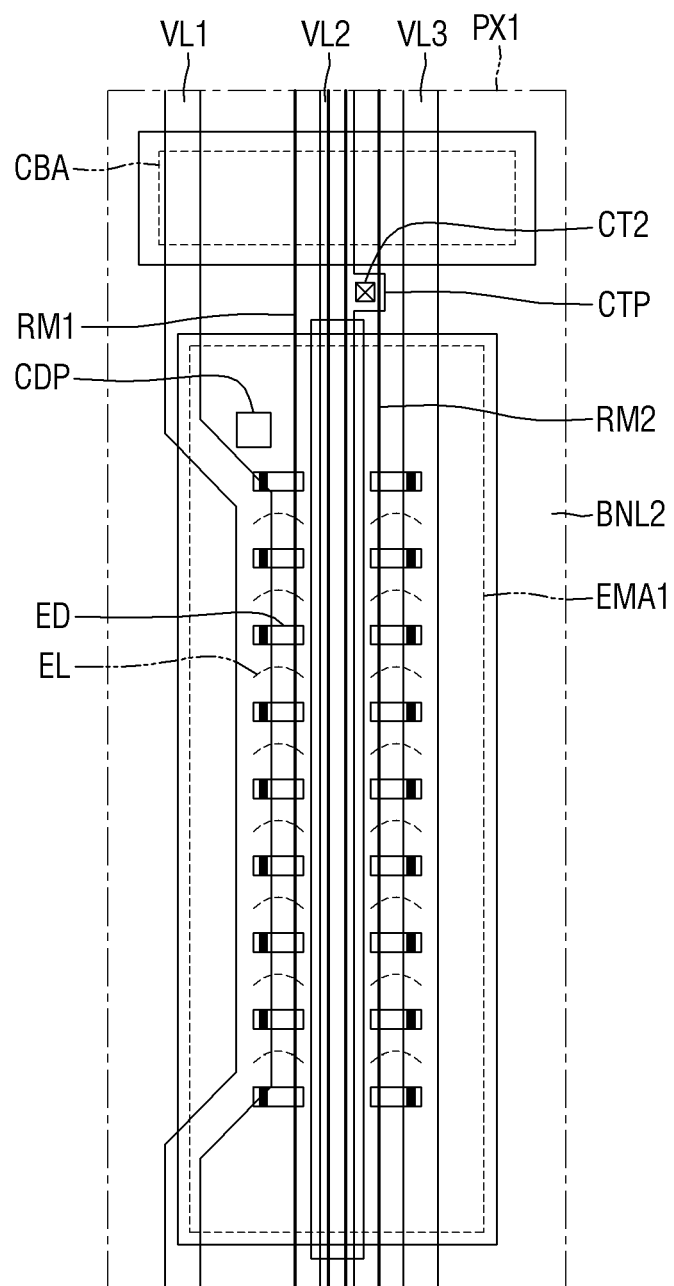
FIG. 14 is a plan view illustrating the arrangement of voltage lines and the alignment of light emitting elements of the display device of FIG. 12.
Figure 15:
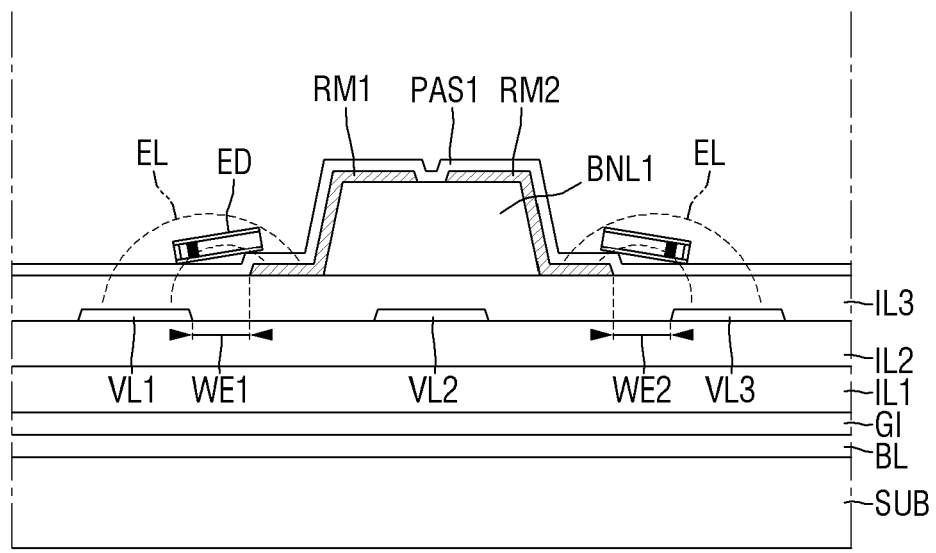
FIG. 15 is a cross-sectional view illustrating the arrangement of voltage lines and the alignment of light emitting elements of the display device of FIG. 14.

FIG. 14 is a plan view illustrating the arrangement of voltage lines and the alignment of light emitting elements of the display device of FIG. 12. FIG. 15 is a cross-sectional view illustrating the arrangement of voltage lines and the alignment of light emitting elements of the display device of FIG. 14.

Referring to FIGS. 14 and 15 in addition to FIG. 12, during the process of manufacturing the display device 10_3, the first electrode line RM1 and the second electrode line RM2 may be disposed on the plurality of sub-pixels PXn. The first electrode line RM1 and the second electrode line RM2 may be disposed on both sides of the first bank BNL1, and may be formed into a plurality of first electrodes RME1_3 and second electrodes RME2_3 as they are cut in the first area CBA in a subsequent process.

In an embodiment, an alignment signal of the same sign is applied to the first electrode line RM1 and the second electrode line RM2, and an alignment signal opposite thereto may be applied to the first voltage line VL1 and the third voltage line VL3. An electric field EL is generated by the alignment signal between the first electrode line RM1 and the first voltage line VL1 and between the second electrode line RM2 and the third voltage line VL3, but may not be generated on the first electrode line RM1 and the second electrode line RM2. The plurality of light emitting elements ED are not disposed on the first bank BNL1, and one end may be disposed on the first electrode line RM1 or the second electrode line RM2.

In some embodiments, the second voltage line VL2 may be disposed between the first voltage line VL1 and the third voltage line VL3, and may be disposed to partially overlap each of the first electrode line RM1 and the second electrode line RM2 in a plan view. The second voltage line VL2 may further include a line contact portion CTP protruding toward one side thereof in the first direction DR1, and the line contact portion CTP may be connected to the second electrode line RM2 through the second contact hole CT2. In the process of generating the electric field EL, an alignment signal may also be applied to the second voltage line VL2, and this alignment signal may have the same sign as the alignment signal applied to the second electrode line RM2.

The display device 10_3 according to the present embodiment may include a larger number of electrodes RME1_3 and RME2_3 for each sub-pixel PXn. Among them, the first electrode RME1_3 that is not connected to the second voltage line VL2 may be disposed in a floating state, so that interference between a signal flowing through the contact electrode thereon and a signal transmitted through the second voltage line VL2 may be reduced or minimized.

In some embodiments, the display device 10 may include a larger number of first banks BNL1 and electrodes, and both ends of the light emitting elements ED may be disposed on the electrodes. In this case, the light emitting element ED may include light emitting elements disposed on the electrode at only one end thereof, and the number of light emitting elements ED disposed in each sub-pixel PXn may increase.

Figure 16:
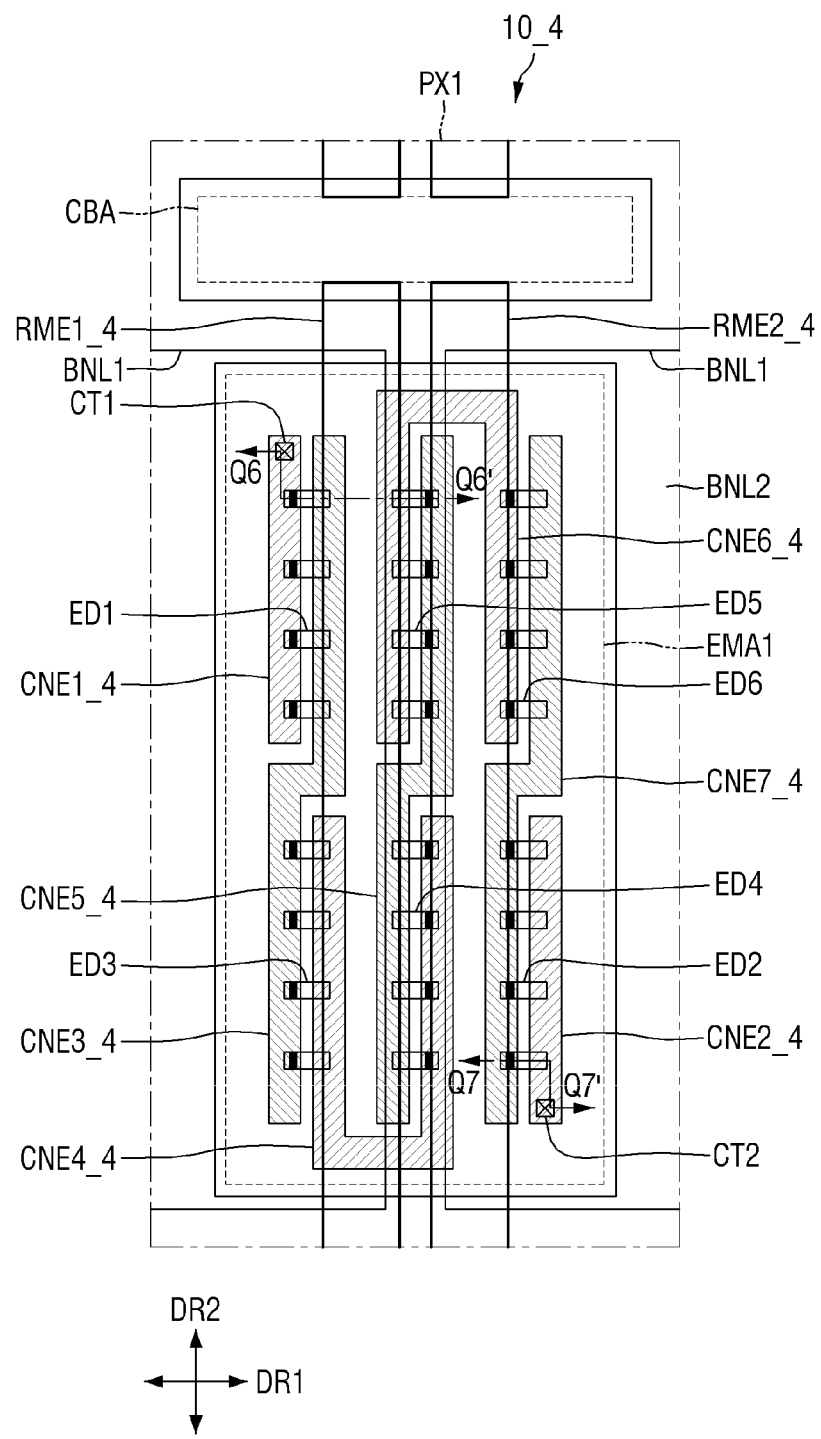
FIG. 16 is a plan view illustrating one sub-pixel of a display device according to another embodiment.
Figure 17:
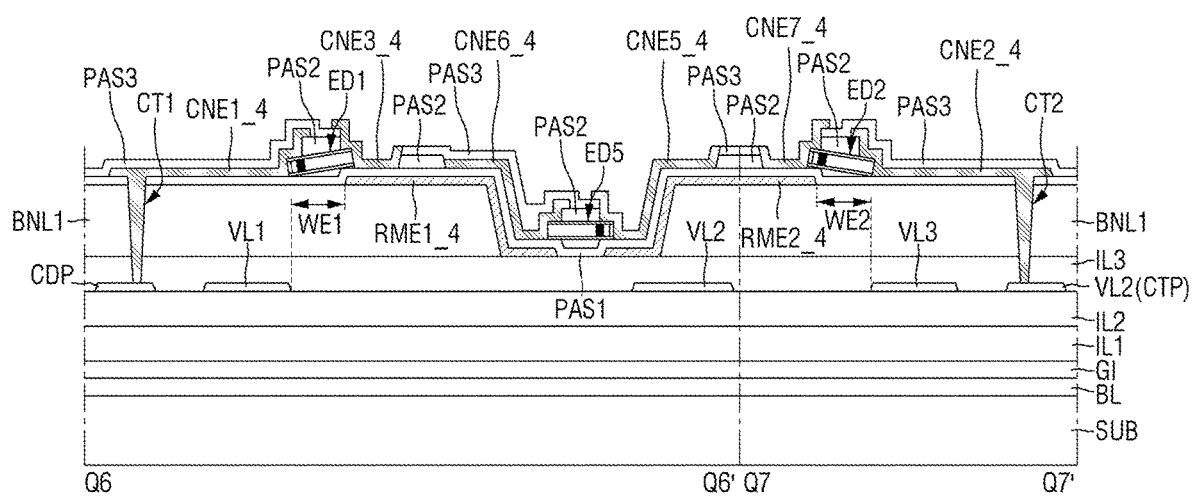
FIG. 17 is a cross-sectional view taken along the lines Q6-Q6' and Q7-Q7' of FIG. 16.
Figure 18:
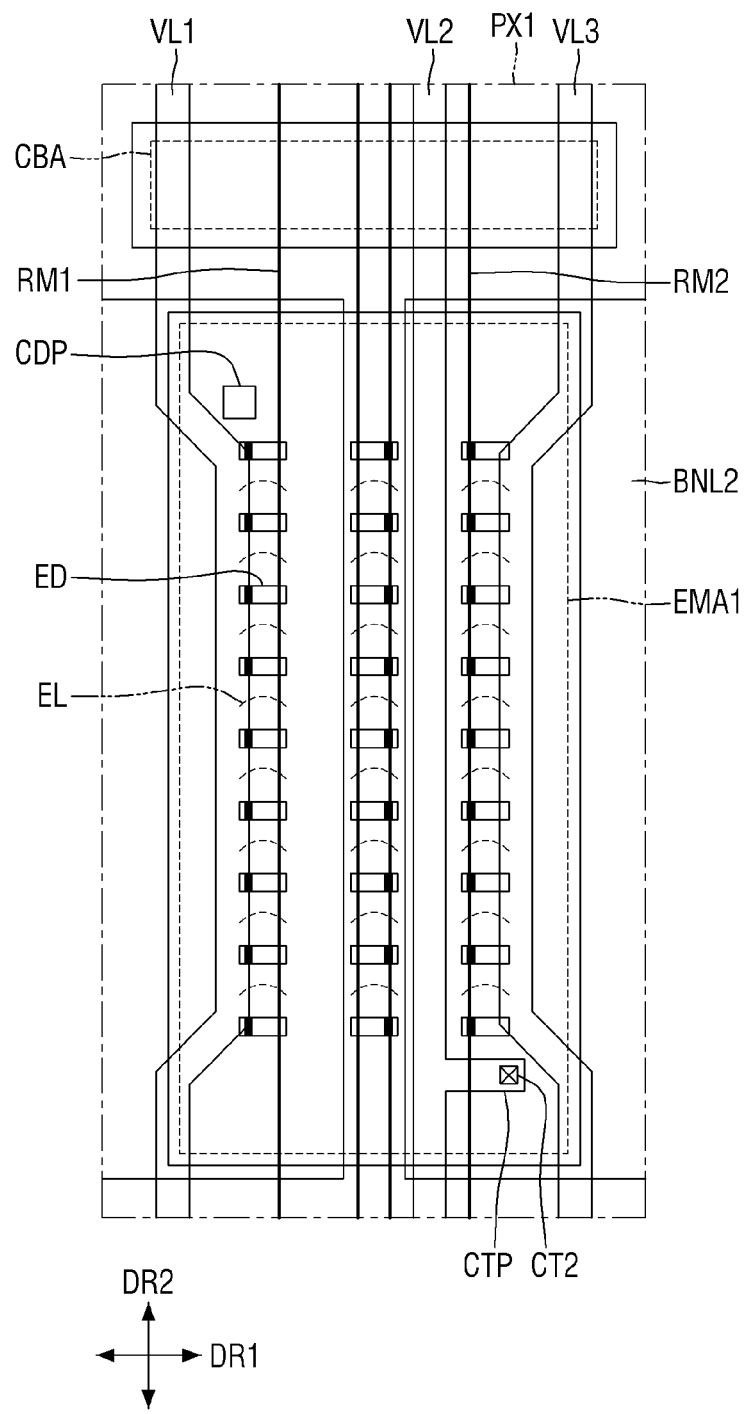
FIG. 18 is a plan view illustrating the arrangement of voltage lines and the alignment of light emitting elements of the display device of FIG. 16.
Figure 19:
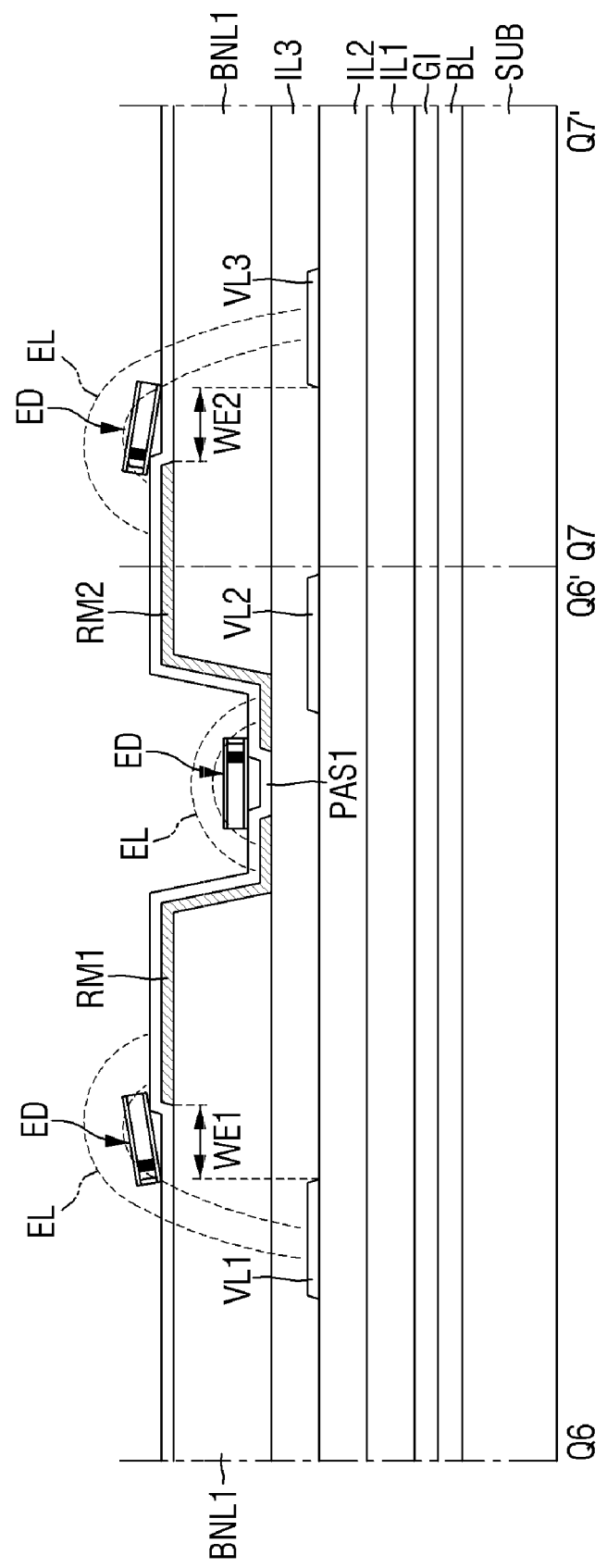
FIG. 19 is a cross-sectional view illustrating the arrangement of voltage lines and the alignment of light emitting elements of the display device of FIG. 18.

FIG. 16 is a plan view illustrating one sub-pixel of a display device according to another embodiment. FIG. 17 is a cross-sectional view taken along the lines Q6-Q6' and Q7-Q7' of FIG. 16. FIG. 18 is a plan view illustrating the arrangement of voltage lines and the alignment of light emitting elements of the display device of FIG. 16. FIG. 19 is a cross-sectional view illustrating the arrangement of voltage lines and the alignment of light emitting elements of the display device of FIG. 18. FIG. 17 illustrates a cross-section of both ends of the first light emitting element ED1 and the second light emitting element ED2 contacting the first contact electrode CNE1_4 or the second contact electrode CNE2_4 at one end thereof.

Referring to FIGS. 16-19, a display device 10_4 according to an embodiment may include a larger number of first banks BNL1 and electrodes RME1_4 and RME24. The first electrode RME14 and the second electrode RME24 are disposed on different first banks BNL1, respectively, and light emitting elements ED may be disposed on the first electrode RME1_4 and the second electrode RME2_4. Further, in the display device 10_4, only one end of the light emitting elements ED may be disposed on the first electrode RME1_4 or the second electrode RME2_4, so that luminance per unit area may be further improved.

For example, in the display device 10_4, a plurality of first banks BNL1 may be arranged in one sub-pixel PXn to be spaced from each other. One first bank BNL1 has a shape extending in the first direction DR1 and is disposed over other neighboring sub-pixels PXn, but may be spaced from another first bank BNL1 disposed in the same sub-pixel PXn in the first direction DR1. The first banks BNL1 may be formed to have suitable widths (e.g., set or predetermined widths) in the first direction DR1 and the second direction DR2. Some of the first banks BNL1 may be disposed in the light emitting area EMA, and others thereof may be disposed over or across the sub-pixels PXn neighboring in the first direction DR1. As the first banks BNL1 are disposed over or across the sub-pixels PXn, a part of the portion of the second bank BNL2 extending in the second direction DR2 may be disposed on the first bank BNL1. Different electrodes RME1_4 and RME2_4 may be arranged on the first banks BNL1 spaced from each other, and light emitting elements ED may be arranged therebetween.

The first electrode RME1_4 and the second electrode RME2_4 may be respectively disposed on different first banks BNL1 to be spaced from each other in the first direction DR1. Each of the electrodes RME1_4 and RME2_4 may be disposed on one side of the first bank BNL1 in the first direction DR1 to be disposed on an inclined side of the first bank BNL1. Further, the interval between the plurality of electrodes RME1_4 and RME2_4 in the first direction DR1 may be narrower than the interval between the first banks BNL1. Each of the electrodes RME1_4 and RME2_4 may have at least some regions directly disposed on the third interlayer insulating layer IL3 such that they may be disposed on the same plane.

According to an embodiment, the first electrode RME1_4 and the second electrode RME2_4 may not have contact holes CT1 and CT2, respectively, and may not be connected to a conductive layer under the first electrode RME1_4 and the second electrode RME2_4. As described above, the electrodes RME1_4 and RME2_4 may be formed by separating the electrode lines RM1 and RM2, and the electrode lines RM1 and RM2 may directly receive an alignment signal from an external device. In some embodiments, the electrode lines RM1 and RM2 may be used to arrange the light emitting elements ED, and the electrodes RME1_4 and RME2_4 formed by separating the electrode lines RM1 and RM2 for each sub-pixel PXn and thus the electrodes RME1_4 and RME2_4 may be in a floating state. The plurality of light emitting elements ED may be electrically connected to the underlying conductive layer or to the first transistor T1 and the second voltage line VL2 through the first contact electrode CNE1_4 and the second contact electrode CNE2_4, so that the light emitting elements ED may emit light even if the first electrode RME1_4 and the second electrode RME2_4 are disposed in a floating state.

The plurality of light emitting elements ED may be arranged on the electrode lines RM1 and RM2, the first voltage line VL1, and the third voltage line VL3 by an electric field EL generated thereon. In the display device 10_4 according to the present embodiment, alignment signals having different signs (e.g., polarities) may be applied to the first electrode line RM1 and the second electrode line RM2, respectively, and some of the light emitting elements ED may be arranged on the first electrode RME1_4 and the second electrode RME2_4.

For example, the light emitting element ED may include a first light emitting element ED1 and a third light emitting element ED3 each having one end disposed on the other side of the first electrode RME1_4 in the first direction DR1, and a second light emitting element ED2 and a sixth light emitting element ED6 each having one end disposed on one side of the second electrode RME2_4 in the first direction DR1. In addition, the display device 10_4 according to an embodiment may include a fourth light emitting element ED4 and a fifth light emitting element ED5 each having one end disposed on the first electrode RME1_4 and the other end disposed on the second electrode RME2_4.

Because the width of each of the first electrode RME1_4 and the second electrode RME2_4 is smaller than the width of the first bank BNL1, the first light emitting element ED1, the second light emitting element ED2, the third light emitting element ED3, and the sixth light emitting element ED6 may be respectively disposed on the first bank BNL1. In contrast, the fourth light emitting element ED4 and the fifth light emitting element ED5 may be disposed between the adjacent first banks BNL1 spaced from each other.

During the process of manufacturing the display device 10_4, alignment signals may be applied to the first voltage line VL1, the first electrode line RM1, the second electrode line RM2, and the third voltage line VL3, respectively. Unlike the embodiment of FIG. 12, alignment signals having different signs (e.g., polarities) may be applied to the first electrode line RM1 and the second electrode line RM2 such that an electric field EL may be generated. Based on this, the first voltage line VL1 may be applied with an alignment signal having a sign opposite to that of the first electrode line RM1, that is, an alignment signal having the same sign as the second electrode line RM2, and the third voltage line VL3 may be applied with an alignment signal having a sign opposite to that of the second electrode line RM2, that is, an alignment signal having the same sign as the first electrode line RM1. Accordingly, in the first light emitting element ED1, the second light emitting element ED2, the third light emitting element ED3, and the sixth light emitting element ED6, the direction in which the first end faces may be opposite to the first direction DR1, and in the fourth light emitting element ED4 and the fifth light emitting element ED5, the direction in which the first end faces may be the same as the first direction DR1. The first to sixth light emitting elements ED1 to ED6 may be connected to the underlying conductive layer through the plurality of contact electrodes.

The first contact electrode CNE1_4 may be disposed on the first end of the first light emitting element ED1 and be in contact with the first end thereof. The first contact electrode CNE1_4 may be electrically connected to the first transistor T1 through the first contact hole CT1. The second contact electrode CNE2_4 may be disposed on the second end of the second light emitting element ED2 and be in contact with the second end thereof. Unlike other embodiments, the second contact electrode CNE2_4 may be disposed so as not to contact the first electrode RME1_4 and the second electrode RME2_4. As the first end of the second light emitting element ED2 is disposed on the second electrode RME2_4, the second contact electrode CNE2_4 contacting the second end may be disposed so as not to overlap the second electrode RME2_4 to contact the second end of the second light emitting element ED2.

In an embodiment, the first contact electrode CNE1_4 and the second contact electrode CNE2_4 may be respectively disposed on the first bank BNL1, and may be connected to the underlying conductive layer respectively through the contact holes CT1 and CT2 penetrating the first insulating layer PAS1, the first bank BNL1, and the third interlayer insulating layer IL3. The first contact electrode CNE1_4 may be connected to the first conductive pattern CDP through the first contact hole CT1, and the second contact electrode CNE2_4 may be connected to the line contact portion CTP of the second voltage line VL2 through the second contact hole CT2. As the display device 10_4 includes the light emitting elements ED having both ends disposed on the electrodes RME1_4 and RME2_4, the light emitting elements ED having only one end disposed on the electrodes RME1_4 and RME2_4 may be disposed on the first bank BNL1. For example, the first contact electrode CNE1_4 contacting the first end of the first light emitting element ED1 and the second contact electrode CNE2_4 contacting the second end of the second light emitting element ED2 may be disposed on the first bank BNL1 without overlapping the electrodes RME1_4 and RME2_4, and may be connected to the underlying conductive layer respectively through the contact holes CT1 and CT2 penetrating the first bank BNL1.

The third contact electrode CNE3_4 may have the same shape as the embodiment of FIG. 12 and may be disposed to contact the second end of the first light emitting element ED1 and the first end of the third light emitting element ED3. The fourth contact electrode CNE4_4 may also have the same shape as the embodiment of FIG. 12 and may contact the second end of the third light emitting element ED3 and the first end of the fourth light emitting element ED4. The fourth contact electrode CNE4_4 may include a portion disposed on the other side of the first electrode RME1_4 in the first direction DR1 and a portion disposed on the other side of the second electrode RME2_4 in the first direction DR1. The fifth contact electrode CNE5_4 may have the same shape as the embodiment of FIG. 12 and may contact the second end of the fourth light emitting element ED4 and the first end of the fifth light emitting element ED5. The fifth contact electrode CNE5_4 includes a portion disposed on one side of the first electrode RME1_4 in the first direction DR1 and a portion disposed on one side of the second electrode RME2_4 in the first direction DR1.

The sixth contact electrode CNE6_4 may have a similar shape to the fourth contact electrode CNE4_4 and may be disposed to contact the second end of the fifth light emitting element ED5 and the first end of the sixth light emitting element ED6. The sixth contact electrode CNE6_4 may include a portion disposed on one side of the first electrode RME1_4 in the first direction DR1 and a portion disposed on one side of the second electrode RME2_4 in the first direction DR1. The seventh contact electrode CNE7_4 may have a similar shape to the third contact electrode CNE3_4 and may be disposed to contact the second end of the sixth light emitting element ED6 and the first end of the second light emitting element ED2.

In the first contact electrode CNE1_4, the second contact electrode CNE2_4, the third contact electrode CNE3_4, and the seventh contact electrode CNE7_4, portions contacting one end of the light emitting element ED may be disposed so as not to overlap the electrodes RME1_4 and RME2_4. In the fourth contact electrode CNE4_4, the fifth contact electrode CNE5_4, and the sixth contact electrode CNE6_4, portions contacting one end of the light emitting element ED may be disposed on the electrodes RME1_4 and RME2_4.

In the present embodiment, a larger number of electrodes RME1_4 and RME2_4 may be arranged on the first bank BNL1, or a plurality of light emitting elements ED may be provided therebetween. Even when only the two electrodes RME1_4 and RME2_4 or only the two electrode lines RM1 and RM2 are provided, an electric field is generated by using the underlying first and third voltage lines VL1 and VL3, so that a light emitting element ED having the same alignment as that in which the electric field was generated using the four electrode lines may be provided. The first to sixth light emitting elements ED1 to ED6 may be connected in series to each other through the first to seventh contact electrodes CNE1_4 to CNE7_4, and the light emitting elements ED may be connected in a 6-series configuration, thereby further improving the luminance of the display device 10_4.

Figure 20:
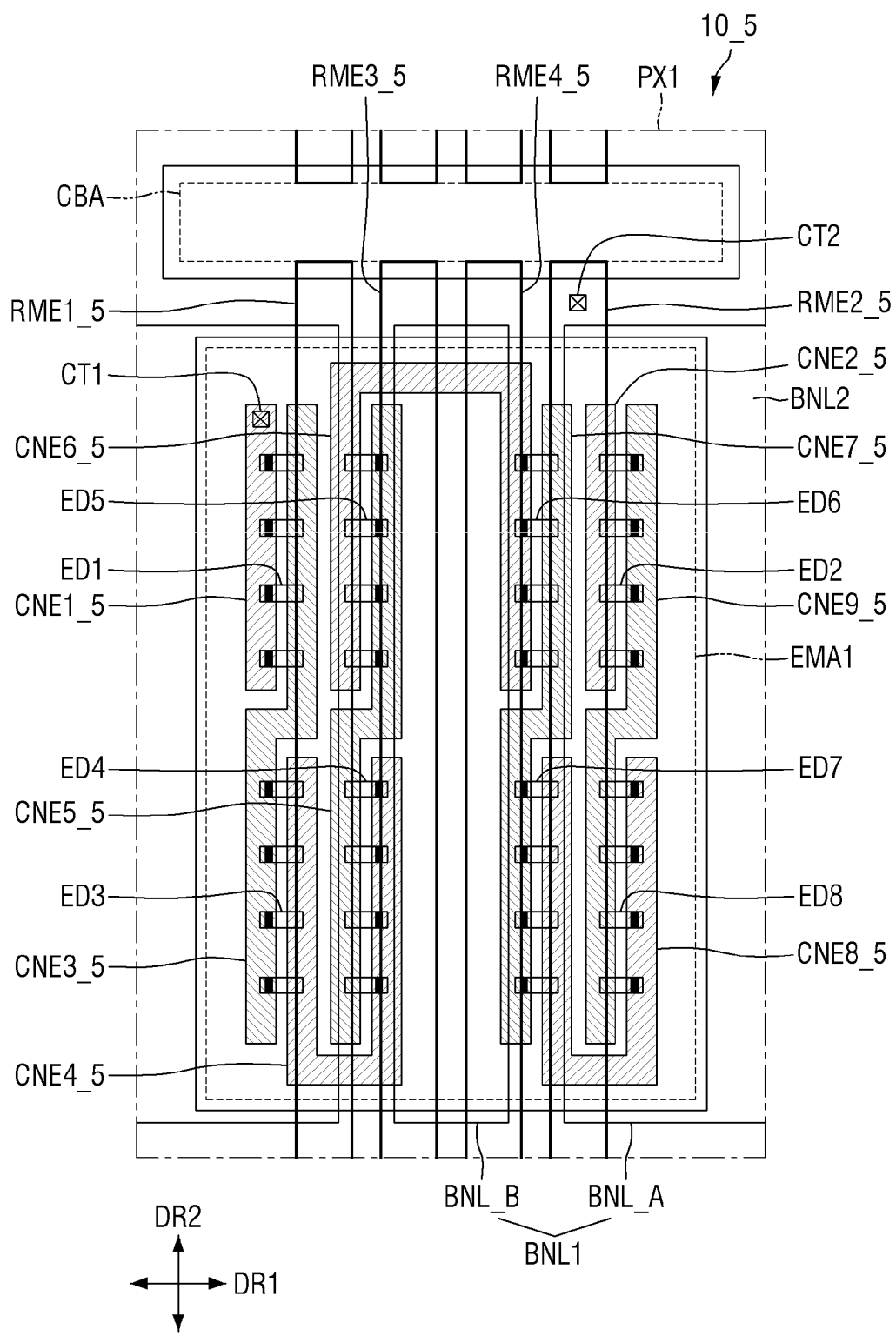
FIG. 20 is a plan view illustrating one sub-pixel of a display device according to another embodiment.
Figure 21:
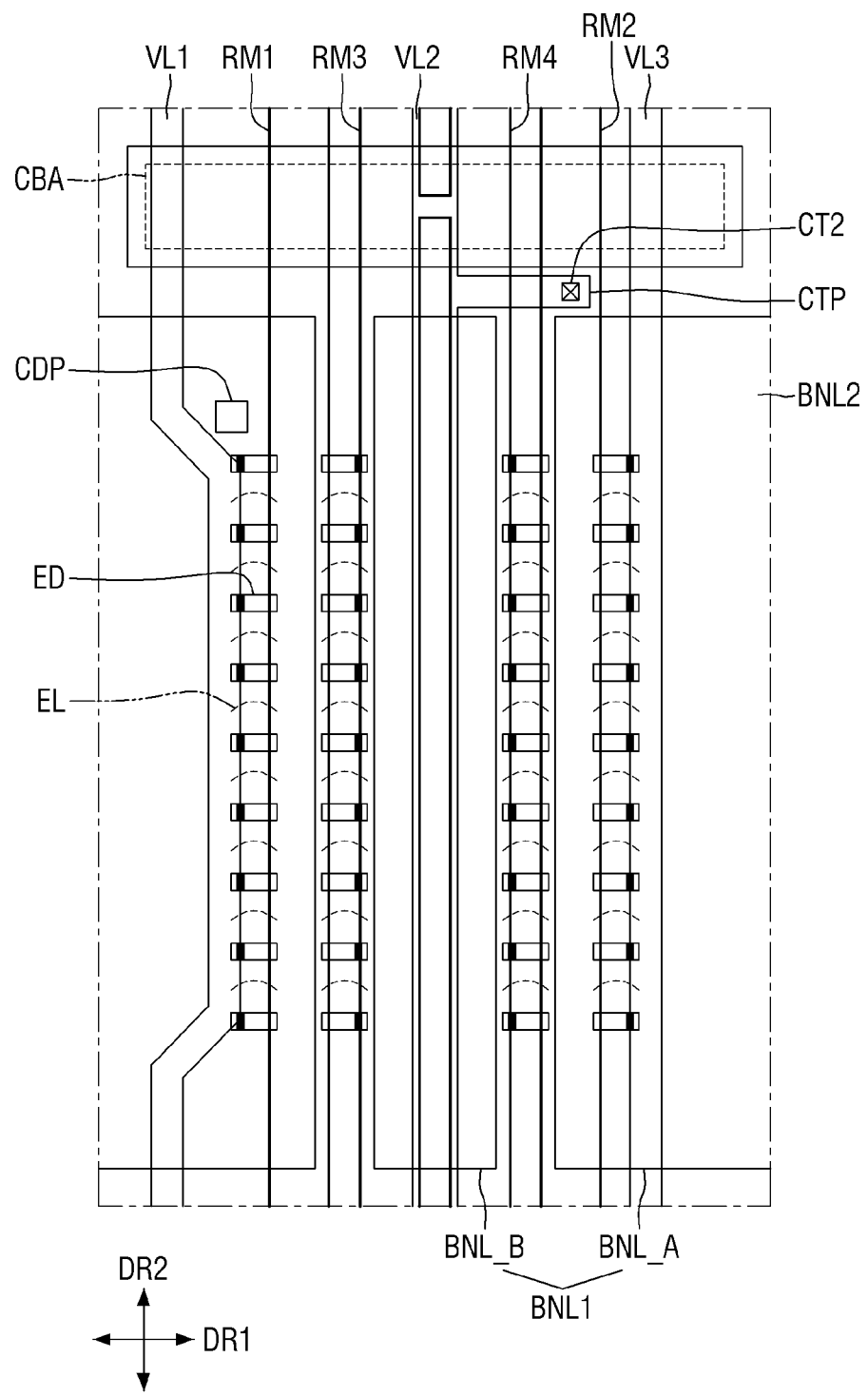
FIG. 21 is a plan view illustrating the arrangement of voltage lines and the alignment of light emitting elements of the display device of FIG. 20.
Figure 22:
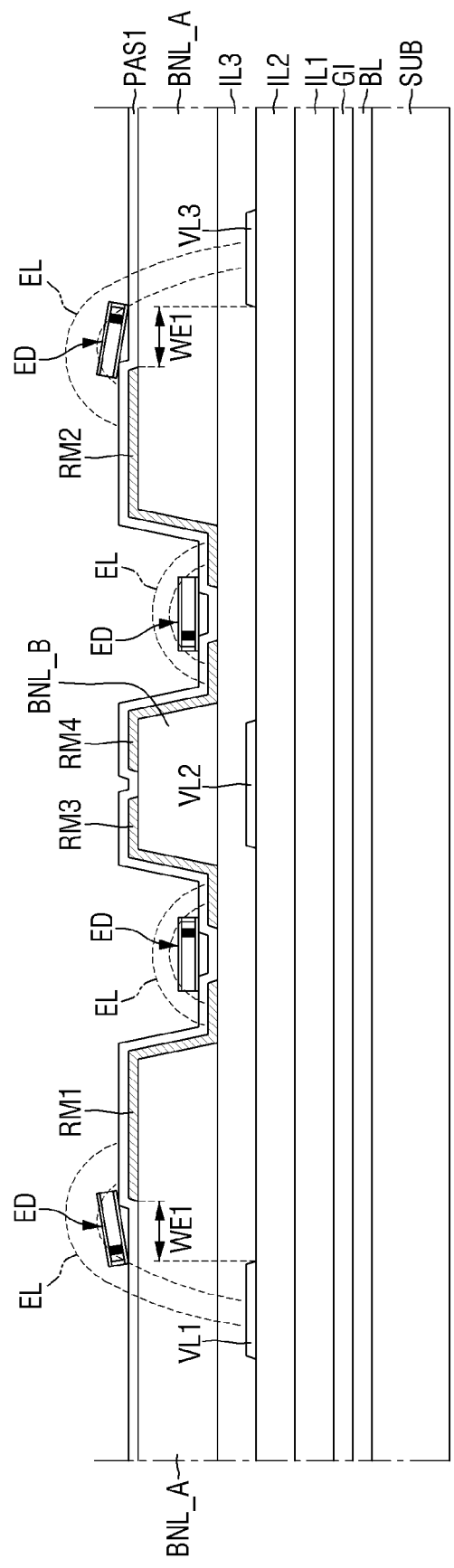
FIG. 22 is a plan view illustrating the arrangement of voltage lines and the alignment of light emitting elements of the display device of FIG. 21.

FIG. 20 is a plan view illustrating one sub-pixel of a display device according to another embodiment. FIG. 21 is a plan view illustrating the arrangement of voltage lines and the alignment of light emitting elements of the display device of FIG. 20. FIG. 22 is a plan view illustrating the arrangement of voltage lines and the alignment of light emitting elements of the display device of FIG. 21.

Referring to FIGS. 20-22, a display device 10_5 may include a larger number of light emitting elements ED and a larger number of electrodes RME1_5, RME2_5, RME3_5, and RME4_5. Hereinafter, redundant descriptions will be reduced or minimized, and the arrangement of electrodes will be described based on differences from other embodiments.

In the display device 10_5, the first bank BNL1 may include a plurality of first sub-banks BNL_A and a second sub-bank BNL_B. The first sub-bank BNL_A may be disposed in the same manner as the first bank BNL1 of FIG. 16, and the second sub-bank BNL_B may have the same shape as the first bank BNL1 of FIG. 3 and may be disposed between the first sub-banks BNL_A.

The first electrode RME1_5 and the second electrode RME2_5 are disposed on different first sub-banks BNL_A, respectively. The second electrode RME2_5 may be connected to the line contact portion CTP of the second voltage line VL2 through the second contact hole CT2 as in the embodiment of FIG. 12. The third electrode RME3_5 and fourth electrode RME4_5 disposed on both sides of the second sub-bank BNL_B may be disposed between the first electrode RME1_5 and the second electrode RME2_5, respectively. The third electrode RME3_5 may face the first electrode RME1_5, and the fourth electrode RME4_5 may face the second electrode RME2_5.

In the process of manufacturing the display device 10_5, alignment signals may be applied to the first electrode line RM1, the second electrode line RM2, the third electrode line RM3, and the fourth electrode line RM4 in addition to the first voltage line VL1 and the third voltage line VL3. Alignment signals of the same sign may be applied to the third electrode line RM3 and the fourth electrode line RM4 such that an electric field EL is not generated between the third electrode line RM3 and the fourth electrode line RM4. In some embodiments, the third electrode line RM3 and the fourth electrode line RM4 may be connected to each other in the first area CBA. As the third electrode line RM3 and fourth electrode line RM4 disposed in the first area CBA are cut in a subsequent process, the third electrode RME3_5 and the fourth electrode RME4_5 may be separated from each other.

Alignment signals having opposite signs (e.g., polarities) to the third electrode line RM3 and the fourth electrode line RM4 may be applied to the first electrode line RM1 and the second electrode line RM2, respectively, and alignment signals having opposite signs (e.g., polarities) to the third electrode line RM3 and the fourth electrode line RM4 may be applied to the first voltage line VL1 and the third voltage line VL3, respectively. The electric field EL for the arrangement of the light emitting elements ED may be generated between the first voltage line VL1 and the first electrode line RM1, between the first electrode line RM1 and the third electrode line RM3, between the fourth electrode line RM4 and the second electrode line RM2, and between the second electrode line RM2 and the third voltage line VL3. The light emitting elements ED may be disposed at a place where the electric field EL is generated.

In the first light emitting element ED1 and the third light emitting element ED3, the second end thereof is disposed on the first electrode RME1_5 by the electric field generated between the first voltage line VL1 and the first electrode line RM1. In the fourth light emitting element ED4 and the fifth light emitting element ED5, both ends thereof are disposed on the first electrode RME1_5 and the third electrode RME3_5 by the electric field generated between the first electrode line RM1 and the third electrode line RM3. In the sixth light emitting element ED6 and the seventh light emitting element ED7, both ends thereof are disposed on the fourth electrode RME4_5 and the second electrode RME2_5 by the electric field generated between the fourth electrode line RM4 and the second electrode line RM2. In the second light emitting element ED2 and the eighth light emitting element ED8, the second end thereof is disposed on the second electrode RME2_5 by the electric field generated between the third voltage line VL3 and the second electrode line RM2.

The first contact electrode CNE1_5 may be disposed on the first end of the first light emitting element ED1 to contact the first end thereof. The second contact electrode CNE2_5 may be disposed on the second end of the second light emitting element ED2 and the second electrode RME2_5 to contact the second end of the second light emitting element ED2 and the second electrode RME2_5. The first contact electrode CNE1_5 may be electrically connected to the first transistor T1 through the first contact hole CT1, and the second contact electrode CNE2_5 may be electrically connected to the second voltage line VL2 through the second electrode RME2_5 connected to the second voltage line VL2 through the second contact hole CT2.

The third contact electrode CNE3_5 may have the same shape as the embodiment of FIG. 16 and may be disposed to contact the second end of the first light emitting element ED1 and the first end of the third light emitting element ED3. The fourth contact electrode CNE4_5 may also have the same shape as the embodiment of FIG. 16 and may contact the second end of the third light emitting element ED3 and the first end of the fourth light emitting element ED4. The fourth contact electrode CNE4_5 may include a portion disposed on the other side of the first electrode RME1_5 in the first direction DR1 and a portion disposed on the other side of the third electrode RME3_5 in the first direction DR1. The fifth contact electrode CNE5_5 may have the same shape as the embodiment of FIG. 16 and may contact the second end of the fourth light emitting element ED4 and the first end of the fifth light emitting element ED5. The fifth contact electrode CNE5_5 may include a portion disposed on one side of the first electrode RME1_5 in the first direction DR1 and a portion disposed on one side of the third electrode RME3_5 in the first direction DR1. The sixth contact electrode CNE6_5 may have the same shape as the embodiment of FIG. 16 and may be disposed to contact the second end of the fifth light emitting element ED5 and the first end of the sixth light emitting element ED6. The sixth contact electrode CNE6_5 may include a portion disposed on one side of the first electrode RME1_5 in the first direction DR1 and a portion disposed on one side of the fourth electrode RME4_5 in the first direction DR1. The seventh contact electrode CNE7_5 may have the same shape as the embodiment of FIG. 16 and may be disposed to contact the second end of the sixth light emitting element ED6 and the first end of the seventh light emitting element ED7. The seventh contact electrode CNE7_5 may include a portion disposed on the other side of the second electrode RME2_5 in the first direction DR1 and a portion disposed on one side of the fourth electrode RME4_5 in the first direction DR1.

An eighth contact electrode CNE8_5 may have a similar shape to the fourth contact electrode CNE4_5 and may be disposed to contact the second end of the seventh light emitting element ED7 and the first end of the eighth light emitting element ED8. A ninth contact electrode CNE9_5 may have a similar shape to the third contact electrode CNE3_5 and may be disposed to contact the second end of the eighth light emitting element ED8 and the first end of the second light emitting element ED2.

The first contact electrode CNE1_5, the third contact electrode CNE3_5, the eighth contact electrode CNE8_5, and the ninth contact electrode CNE9_5 may be disposed such that the portion contacting any one end of the light emitting element ED does not overlap the electrodes. The fourth contact electrode CNE4_5, the fifth contact electrode CNE5_5, the second contact electrode CNE2_5, the sixth contact electrode CNE6_5, and the seventh contact electrode CNE7_5 may be disposed such that the portions contacting any one end of the light emitting element ED are disposed on the electrodes.

In the present embodiment, a larger number of electrodes RME1_5, RME2_5, RME3_5, and RME4_5 may be arranged on the first sub-bank BNL_A and the second sub-bank BNL_B, or a plurality of light emitting elements ED may be provided between the first sub-bank BNL_A and the second sub-bank BNL_B. Even when only the four electrodes RME1_5, RME2_5, RME3_5, and RME4_5 or only the four electrode lines RM1, RM2, RM3, and RM4 are provided, an electric field is generated by using the underlying first and third voltage lines VL1 and VL3, so that a light emitting element ED having the same alignment as that in which the electric field was generated using the six electrode lines may be provided. The first to eighth light emitting elements ED1 to ED8 may be connected in series to each other through the first to ninth contact electrodes CNE1_5 to CNE9_5, and the light emitting elements ED may be connected in a 8-series configuration, thereby further improving the luminance of the display device 10_5.

In a display device according to an embodiment, an area required to form a light emitting area of each sub-pixel may be reduced or minimized. Further, the display device according to an embodiment may have a feature that a desirable number of light emitting elements (e.g., a set or predetermined number of light emitting elements) may be arranged without limitation in the light emitting area, and a high-resolution display device with a large light emitting area or high luminance with respect to the unit area may be implemented.

In concluding the detailed description, those skilled in the art will appreciate that many variations and modifications can be made to embodiments of the present disclosure without substantially departing from the scope of the present disclosure. Therefore, the disclosed embodiments of the present disclosure are used in a generic and descriptive sense only and not for purposes of limitation. The present disclosure is also defined in the following claims, and equivalents thereof.

What is claimed is:

1. A display device, comprising:
   a first substrate;
   a conductive layer comprising a first voltage line configured to supply a first voltage, a second voltage line configured to supply a second voltage, and a third voltage line spaced from each other along a first direction on the first substrate, the first voltage being different from the second voltage;
   an interlayer insulating layer on the conductive layer;
   first and second electrodes on the interlayer insulating layer and spaced from each other along the first direction;
   a plurality of light emitting elements having at least one end on and overlapping the first electrode or the second electrode;
   a first contact electrode on first ends of some of the plurality of light emitting elements and not overlapping the first electrode and the second electrode; and
   a second contact electrode on second ends of some of the plurality of light emitting elements,
   wherein the first electrode and the second electrode do not overlap the first voltage line and the third voltage line, respectively,
   wherein the plurality of light emitting elements comprises first light emitting elements on the first electrode and the first voltage line, and second light emitting elements on the second electrode and the third voltage line, and
   wherein the first voltage line, the second voltage line, and the third voltage line are located at a layer that is different from a layer in which the first contact electrode is located.

2. The display device of claim 1,
   wherein the first contact electrode is electrically connected to the first voltage line through a first contact hole penetrating the interlayer insulating layer, and
   the first end of at least one of the first light emitting elements is in contact with the first contact electrode, and the second end of the at least one of the first light emitting elements is located on the first electrode.

3. The display device of claim 2,
   wherein the second electrode is in contact with the second voltage line through a second contact hole penetrating the interlayer insulating layer, and
   the second contact electrode is in contact with the second end of at least one of the second light emitting elements and the second electrode.

4. The display device of claim 3,
   wherein the plurality of light emitting elements further comprises a third light emitting element having a first end not contacting the first contact electrode and a second end located on the first electrode, and
   a fourth light emitting element having a second end located on the second electrode and not contacting the second contact electrode, and
   the display device further comprises a third contact electrode contacting the second end of the first light emitting element and the first end of the third light emitting element,
   a fourth contact electrode contacting the second end of the third light emitting element and a first end of the fourth light emitting element, and
   a fifth contact electrode contacting the second end of the fourth light emitting element and the first end of the at least one of the second light emitting elements.

5. The display device of claim 2, further comprising:
   a first bank on the interlayer insulating layer,
   wherein the first electrode and the second electrode are located on the first bank and are spaced from each other.

6. The display device of claim 2, further comprising:
   third and fourth electrodes between the first electrode and the second electrode;
   a fifth light emitting element on the first electrode and the third electrode; and
   a sixth light emitting element on the fourth electrode and the second electrode.

7. The display device of claim 6, further comprising:
   a plurality of first sub-banks between the interlayer insulating layer and the first electrode and between the interlayer insulating layer and the second electrode; and
   a second sub-bank between the first sub-banks,
   wherein the third electrode and the fourth electrode are spaced from each other on the second sub-bank.

8. The display device of claim 7,
   wherein the first light emitting elements and the second light emitting elements are located on different first sub-banks, and
   the fifth light emitting element and the sixth light emitting element are located between the plurality of first sub-banks and the second sub-bank.

9. The display device of claim 2,
   wherein the first contact electrode is electrically connected to a first transistor located on the first substrate and connected to the first voltage line, and
   the first voltage line, the second voltage line, and the third voltage line are located at a same layer as a source electrode of the first transistor.

10. The display device of claim 2,
    wherein the plurality of light emitting elements further comprises a third light emitting element having both ends on the first electrode and the second electrode,
    the first contact electrode and the second contact electrode do not overlap the first electrode and the second electrode, and
    the display device further comprises a plurality of contact electrodes partially located on the first electrode or the second electrode.

11. The display device of claim 10,
wherein the second contact electrode is in contact with the second voltage line through a second contact hole penetrating the interlayer insulating layer, and
at least one of the second light emitting elements has the first end on the second electrode.

12. The display device of claim 11, further comprising:
a plurality of first banks between the interlayer insulating layer and the first electrode and between the interlayer insulating layer and the second electrode,
wherein the third light emitting element is between the first banks.

13. The display device of claim 12,
wherein the first light emitting element and the second light emitting element are located on the plurality of first banks, and
each of the first contact hole and the second contact hole penetrates the first bank.

14. The display device of claim 1,
wherein a shortest vertical distance between the first electrode and the first voltage line is shorter than a length of the first light emitting element.

15. A display device, comprising:
a first substrate;
a conductive layer comprising a first voltage line configured to supply a first voltage, and a second voltage line configured to supply a second voltage, on the first substrate and spaced from each other along a first direction and extending in a second direction, the first voltage being different from the second voltage;
an interlayer insulating layer on the conductive layer;
a first electrode extending in the second direction and on the interlayer insulating layer, the first electrode overlapping the second voltage line;
a plurality of light emitting elements, at least one of the light emitting elements having one end on the first electrode and extending in one direction;
a first contact electrode on an other end of the light emitting element; and
a second contact electrode on the one end of the light emitting element and contacting the first electrode,
wherein the first electrode and the first voltage line do not overlap each other in a thickness direction of the first substrate, and
wherein the first voltage line and the second voltage line are located at a layer that is different from a layer in which the first contact electrode is located.

16. The display device of claim 15,
wherein the first contact electrode is connected to a conductive pattern electrically connected to the first voltage line through a first contact hole penetrating the interlayer insulating layer, and
the first electrode is connected to the second voltage line through a second contact hole penetrating the interlayer insulating layer.

17. The display device of claim 16, further comprising:
a third voltage line spaced from the second voltage line in the second direction and not overlapping the first electrode in the thickness direction,
wherein the plurality of light emitting elements comprises a first light emitting element having an other end on the first voltage line and a second light emitting element having an other end on the third voltage line.

18. The display device of claim 17,
wherein the first contact electrode comprises a first extension portion on the other end of the first light emitting element, a second extension portion on the other end of the second light emitting element, and a first connection portion connecting the first extension portion and the second extension portion and spaced from the second contact electrode.

19. The display device of claim 17,
wherein the first contact electrode is on the other end of the first light emitting element,
the second contact electrode is on one end of the second light emitting element, and
the display device further comprises a third contact electrode located on one end of the first light emitting element and an other end of the second light emitting element to surround the second contact electrode.

20. The display device of claim 17, further comprising:
a first bank between the first electrode and the interlayer insulating layer,
wherein the first voltage line and the third voltage line do not overlap the first bank in the thickness direction of the first substrate.

* * * * *